US010760380B2

(12) United States Patent
Bolchover et al.

(10) Patent No.: US 10,760,380 B2
(45) Date of Patent: Sep. 1, 2020

(54) WELL PLANNING SERVICE

(71) Applicant: Schlumberger Technology Corporation, Sugar Land, TX (US)

(72) Inventors: Paul Bolchover, Beijing (CN); Mark S. Passolt, Hansville, WA (US); Lucian Johnston, Sugar Land, TX (US); Richard William Dearden, Cambridge (GB); Rushen Patel, Cambridge (GB); Qing Liu, Beijing (CN)

(73) Assignee: Schlumberger Technology Corporation, Sugar Land, TX (US)

( * ) Notice: Subject to any disclaimer, the term of this patent is extended or adjusted under 35 U.S.C. 154(b) by 379 days.

(21) Appl. No.: 15/565,910

(22) PCT Filed: Apr. 15, 2016

(86) PCT No.: PCT/US2016/027769
§ 371 (c)(1),
(2) Date: Oct. 12, 2017

(87) PCT Pub. No.: WO2016/172006
PCT Pub. Date: Oct. 27, 2016

(65) Prior Publication Data
US 2018/0106133 A1  Apr. 19, 2018

(30) Foreign Application Priority Data
Apr. 19, 2015  (WO) ............... PCT/CN2015/076928

(51) Int. Cl.
*E21B 41/00*  (2006.01)
*E21B 43/30*  (2006.01)
(Continued)

(52) U.S. Cl.
CPC ............ *E21B 41/0092* (2013.01); *E21B 7/04* (2013.01); *E21B 43/30* (2013.01); *G06F 30/00* (2020.01)

(58) Field of Classification Search
None
See application file for complete search history.

(56) References Cited

U.S. PATENT DOCUMENTS

2005/0209912 A1\* 9/2005 Veeningen ............ G06Q 10/06
  705/7.12
2008/0289877 A1  11/2008 Nikolakis-Mouchas et al.
(Continued)

FOREIGN PATENT DOCUMENTS

WO  WO2005090750 A1  9/2005
WO  WO2006065915 A2  6/2006
(Continued)

OTHER PUBLICATIONS

Cheng, Kun et al. ("China Offshore Anti-Collision Risk Management Standard and Remedial Measures", Mar. 21-23, 2011, SPE Americas E&P Health, Safety, Security and Environmental Conference, Society of Petroleum Engineers. (Year: 2011).\*
(Continued)

*Primary Examiner* — Cedric Johnson
(74) *Attorney, Agent, or Firm* — Alec J. McGinn

(57) ABSTRACT

A method can include receiving well plan information that includes a reservoir target associated with a reservoir of a subterranean environment; based at least in part on characteristics of the subterranean environment, determining well trajectory metrics that comprise a geometrical metric; determining a weighted metric based at least in part on weighting of the well trajectory metrics; and, based at least in part on an assessment of the weighted metric, outputting directional drilling information for a well trajectory to the reservoir target.

20 Claims, 14 Drawing Sheets

(51) Int. Cl.
*E21B 7/04* (2006.01)
*G06F 30/00* (2020.01)

(56) References Cited

U.S. PATENT DOCUMENTS

| | | | |
|---|---|---|---|
| 2008/0300793 A1* | 12/2008 | Tilke | E21B 43/30 |
| | | | 702/13 |
| 2010/0185395 A1* | 7/2010 | Pirovolou | E21B 44/00 |
| | | | 702/9 |
| 2013/0140037 A1 | 6/2013 | Sequeira, Jr. et al. | |
| 2014/0005996 A1 | 1/2014 | Jain et al. | |

FOREIGN PATENT DOCUMENTS

| | | |
|---|---|---|
| WO | WO2007100703 A2 | 9/2007 |
| WO | WO2008144710 A1 | 11/2008 |
| WO | WO2009032416 A1 | 3/2009 |
| WO | WO2013062591 A1 | 5/2013 |
| WO | WO-2014091462 A1 * | 6/2014 ........... G05B 13/042 |
| WO | WO2014091462 A1 | 6/2014 |

OTHER PUBLICATIONS

International Search Report and Written Opinion issued in PCT application PCT/US2016/027769, dated Jul. 20, 2016. 12 pages.
International Search Report and Written Opinion issued in PCT application PCT/CN2015/076928, dated Jan. 13, 2016. 7 pages.

* cited by examiner

WELL PLANNING SERVICE

RELATED APPLICATIONS

This application claims priority to and the benefit of a Patent Cooperation Treaty International Application filed with the State Intellectual Property Office (SIPO) of the P.R.C. (CN) as the Receiving Office (RO) and having Serial No. PCT/CN2015/076928, filed 19 Apr. 2015, which is incorporated by reference herein.

BACKGROUND

A bore can be drilled into a geologic environment where the bore may be utilized for form a well. A rig may be a system of components that can be operated to form a bore in a geologic environment, to transport equipment into and out of a bore in a geologic environment, etc. As an example, a rig may include a system that can be used to drill a bore and to acquire information about a geologic environment, drilling, etc. As an example, a rig can include one or more of the following components and/or equipment: a mud tank, a mud pump, a derrick or a mast, drawworks, a rotary table or a top drive, a drillstring, power generation equipment and auxiliary equipment. As an example, an offshore rig may include one or more of such components, which may be on a vessel or a drilling platform. As an example, a rig or wellsite equipment may be operated to form a bore according to a plan, which may be a well plan.

SUMMARY

A method can include receiving well plan information that includes a reservoir target associated with a reservoir of a subterranean environment; based at least in part on characteristics of the subterranean environment, determining well trajectory metrics that include a geometrical metric; determining a weighted metric based at least in part on weighting of the well trajectory metrics; and, based at least in part on an assessment of the weighted metric, outputting directional drilling information for a well trajectory to the reservoir target. A system can include one or more processors; memory operatively coupled to the one or more processors; processor-executable instructions stored in the memory and executable by at least one of the processors to instruct the system to receive well plan information that includes a reservoir target associated with a reservoir of a subterranean environment; based at least in part on characteristics of the subterranean environment, determine well trajectory metrics that include a geometrical metric; determine a weighted metric based at least in part on weighting of the well trajectory metrics; and, based at least in part on an assessment of the weighted metric, output directional drilling information for a well trajectory to the reservoir target. One or more computer-readable storage media can include computer-executable instructions executable to instruct a computing system to: receive well plan information that includes a reservoir target associated with a reservoir of a subterranean environment; based at least in part on characteristics of the subterranean environment, determine well trajectory metrics that include a geometrical metric; determine a weighted metric based at least in part on weighting of the well trajectory metrics; and, based at least in part on an assessment of the weighted metric, output directional drilling information for a well trajectory to the reservoir target. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

The following description includes embodiments of the best mode presently contemplated for practicing the described implementations. This description is not to be taken in a limiting sense, but rather is made merely for the purpose of describing the general principles of the implementations. The scope of the described implementations should be ascertained with reference to the issued claims.

Various examples pertain to systems, methods, non-transitory computer readable media (CRM), etc. that may be utilized to plan a well (e.g., well planning). As an example, various parameters and weights can be associated with a reservoir are received by an optimizer. For example, consider one or more of the following example parameters such as starting location and ending location of one or more well trajectories. In such an example, one or more services can include anti-collision considerations as to one or more well trajectories with respect to one or more other well trajectories and/or perceived obstacles. As an example, an optimizer can operate iteratively and, after one or more iterations, generate one or more well trajectories. As an example, one or more types of engineering analyses may be performed on one or more well trajectories. As an example, one or more of well trajectories may be rendered to a display, for example, as visual representations that a user can understand. As an example, information rendered to a display and/or printed to paper may be utilized in drilling one or more wells where well trajectories are at least in part in a reservoir or reservoirs.

Figure 1:
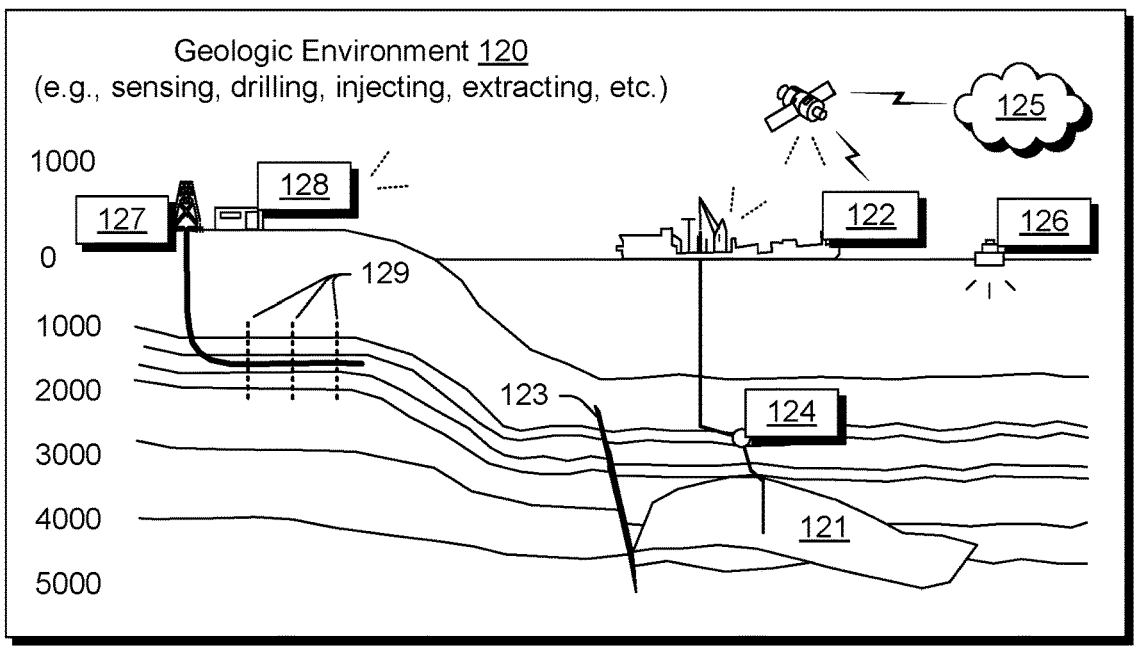
FIG. 1 illustrates examples of equipment in a geologic environment.
Figure 1:
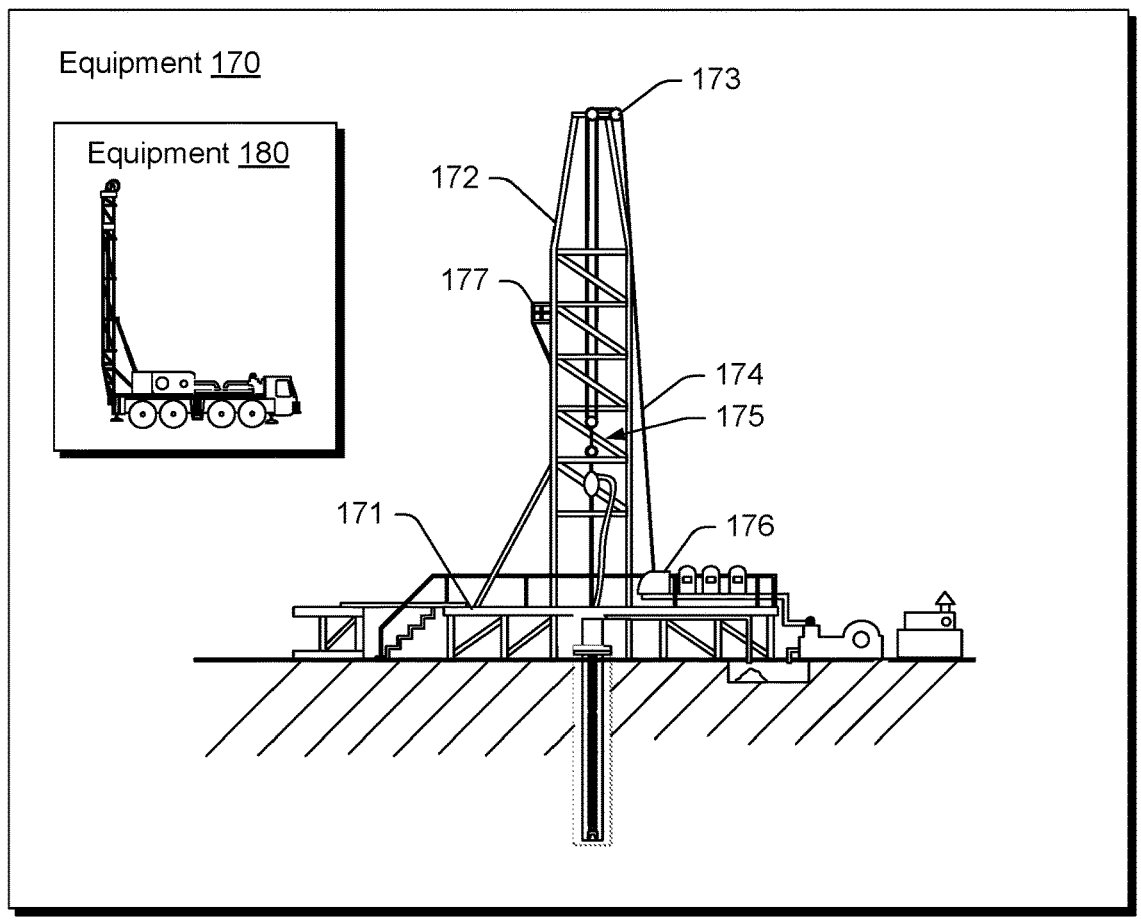

FIG. 1 shows an example of a geologic environment 120. In FIG. 1, the geologic environment 120 may be a sedimentary basin that includes layers (e.g., stratification) that include a reservoir 121 and that may be, for example, intersected by a fault 123 (e.g., or faults). As an example, the geologic environment 120 may be outfitted with any of a variety of sensors, detectors, actuators, etc. For example, equipment 122 may include communication circuitry to receive and to transmit information with respect to one or more networks 125. Such information may include information associated with downhole equipment 124, which may be equipment to acquire information, to assist with resource recovery, etc. Other equipment 126 may be located remote from a well site and include sensing, detecting, emitting or other circuitry. Such equipment may include storage and communication circuitry to store and to communicate data, instructions, etc. As an example, one or more pieces of equipment may provide for measurement, collection, communication, storage, analysis, etc. of data (e.g., for one or more produced resources, etc.). As an example, one or more satellites may be provided for purposes of communications, data acquisition, geolocation, etc. For example, FIG. 1 shows a satellite in communication with the network 125 that may be configured for communications, noting that the satellite may additionally or alternatively include circuitry for imagery (e.g., spatial, spectral, temporal, radiometric, etc.).

FIG. 1 also shows the geologic environment 120 as optionally including equipment 127 and 128 associated with a well that includes a substantially horizontal portion that may intersect with one or more fractures 129. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop the reservoir (e.g., via fracturing, injecting, extracting, etc.). As an example, the equipment 127 and/or 128 may include components, a system, systems, etc. for fracturing, seismic sensing, analysis of seismic data, assessment of one or more fractures, injection, production, etc. As an example, the equipment 127 and/or 128 may provide for measurement, collection, communication, storage, analysis, etc. of data such as, for example, production data (e.g., for one or more produced resources). As an example, one or more satellites may be provided for purposes of communications, data acquisition, etc.

FIG. 1 also shows an example of equipment 170 and an example of equipment 180. Such equipment, which may be systems of components, may be suitable for use in the geologic environment 120. While the equipment 170 and 180 are illustrated as land-based, various components may be suitable for use in an offshore system. As shown in FIG. 1, the equipment 180 can be mobile as carried by a vehicle; noting that the equipment 170 can be assembled, disassembled, transported and re-assembled, etc.

The equipment 170 includes a platform 171, a derrick 172, a crown block 173, a line 174, a traveling block assembly 175, drawworks 176 and a landing 177 (e.g., a monkeyboard). As an example, the line 174 may be controlled at least in part via the drawworks 176 such that the traveling block assembly 175 travels in a vertical direction with respect to the platform 171. For example, by drawing the line 174 in, the drawworks 176 may cause the line 174 to run through the crown block 173 and lift the traveling block assembly 175 skyward away from the platform 171; whereas, by allowing the line 174 out, the drawworks 176 may cause the line 174 to run through the crown block 173 and lower the traveling block assembly 175 toward the platform 171. Where the traveling block assembly 175 carries pipe (e.g., casing, etc.), tracking of movement of the traveling block 175 may provide an indication as to how much pipe has been deployed.

A derrick can be a structure used to support a crown block and a traveling block operatively coupled to the crown block at least in part via line. A derrick may be pyramidal in shape and offer a suitable strength-to-weight ratio. A derrick may be movable as a unit or in a piece by piece manner (e.g., to be assembled and disassembled).

As an example, drawworks may include a spool, brakes, a power source and assorted auxiliary devices. Drawworks may controllably reel out and reel in line. Line may be reeled over a crown block and coupled to a traveling block to gain mechanical advantage in a "block and tackle" or "pulley" fashion. Reeling out and in of line can cause a traveling block (e.g., and whatever may be hanging underneath it), to be lowered into or raised out of a bore. Reeling out of line may be powered by gravity and reeling in by a motor, an engine, etc. (e.g., an electric motor, a diesel engine, etc.).

As an example, a crown block can include a set of pulleys (e.g., sheaves) that can be located at or near a top of a derrick or a mast, over which line is threaded. A traveling block can include a set of sheaves that can be moved up and down in a derrick or a mast via line threaded in the set of sheaves of the traveling block and in the set of sheaves of a crown block. A crown block, a traveling block and a line can form a pulley system of a derrick or a mast, which may enable handling of heavy loads (e.g., drillstring, pipe, casing, liners, etc.) to be lifted out of or lowered into a bore. As an example, line may be about a centimeter to about five centimeters in diameter as, for example, steel cable. Through use of a set of sheaves, such line may carry loads heavier than the line could support as a single strand.

As an example, a derrick person may be a rig crew member that works on a platform attached to a derrick or a mast. A derrick can include a landing on which a derrick person may stand. As an example, such a landing may be about 10 meters or more above a rig floor. In an operation referred to as trip out of the hole (TOH), a derrick person may wear a safety harness that enables leaning out from the work landing (e.g., monkeyboard) to reach pipe in located at or near the center of a derrick or a mast and to throw a line around the pipe and pull it back into its storage location (e.g., fingerboards), for example, until it a time at which it may be desirable to run the pipe back into the bore. As an example, a rig may include automated pipe-handling equipment such that the derrick person controls the machinery rather than physically handling the pipe.

As an example, a trip may refer to the act of pulling equipment from a bore and/or placing equipment in a bore. As an example, equipment may include a drillstring that can be pulled out of the hole and/or place or replaced in the hole. As an example, a pipe trip may be performed where a drill bit has dulled or has otherwise ceased to drill efficiently and is to be replaced.

Figure 2:
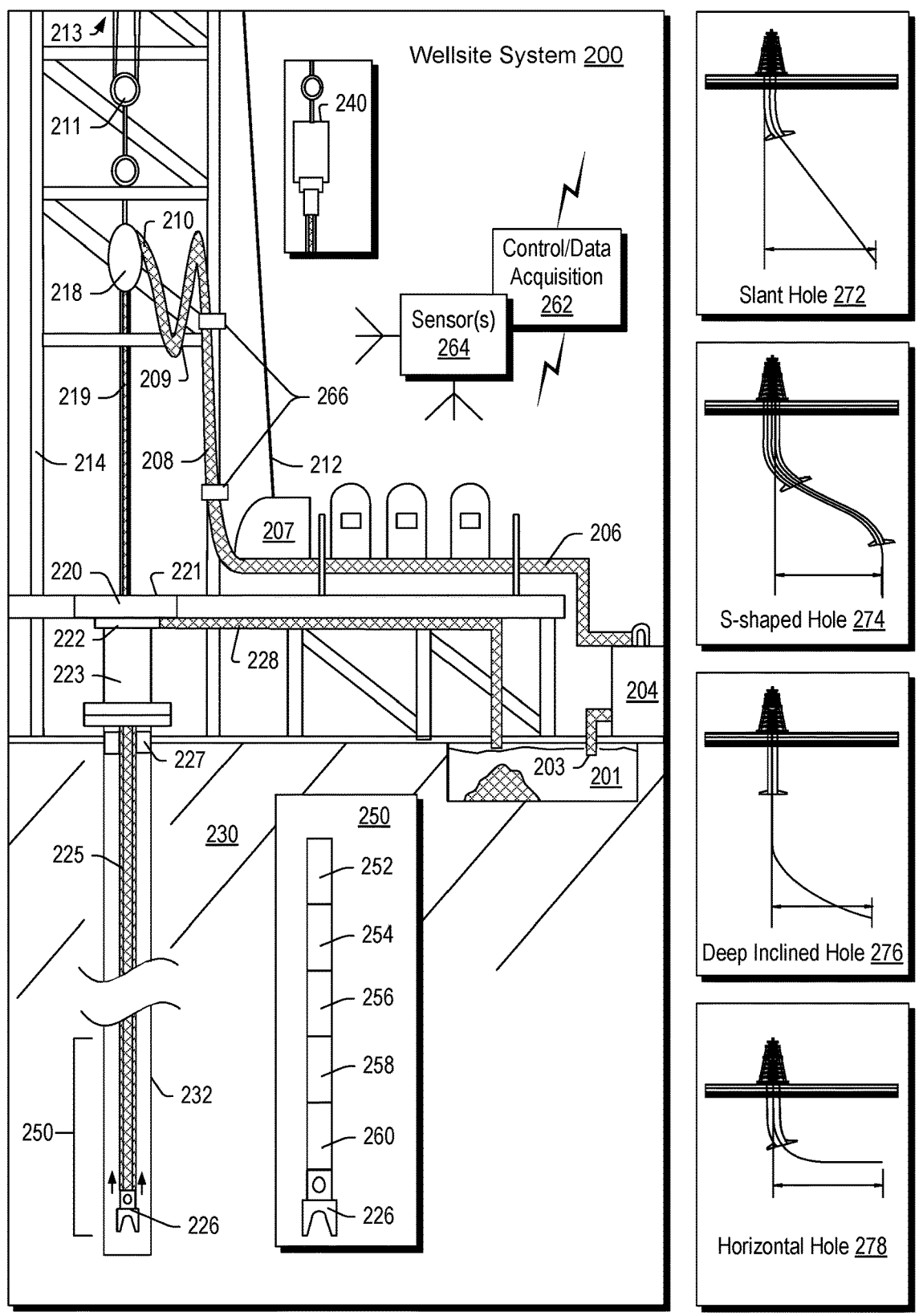
FIG. 2 illustrates an example of a system and examples of types of holes.

FIG. 2 shows an example of a wellsite system 200 (e.g., at a wellsite that may be onshore or offshore). As shown, the wellsite system 200 can include a mud tank 201 for holding mud and other material (e.g., where mud can be a drilling fluid), a suction line 203 that serves as an inlet to a mud pump 204 for pumping mud from the mud tank 201 such that mud flows to a vibrating hose 206, a drawworks 207 for winching drill line or drill lines 212, a standpipe 208 that receives mud from the vibrating hose 206, a kelly hose 209 that receives mud from the standpipe 208, a gooseneck or goosenecks 210, a traveling block 211, a crown block 213 for carrying the traveling block 211 via the drill line or drill lines 212 (see, e.g., the crown block 173 of FIG. 1), a derrick 214 (see, e.g., the derrick 172 of FIG. 1), a kelly 218 or a top drive 240, a kelly drive bushing 219, a rotary table 220, a drill floor 221, a bell nipple 222, one or more blowout preventors (BOPs) 223, a drillstring 225, a drill bit 226, a casing head 227 and a flow pipe 228 that carries mud and other material to, for example, the mud tank 201.

In the example system of FIG. 2, a borehole 232 is formed in subsurface formations 230 by rotary drilling; noting that various example embodiments may also use directional drilling.

As shown in the example of FIG. 2, the drillstring 225 is suspended within the borehole 232 and has a drillstring assembly 250 that includes the drill bit 226 at its lower end. As an example, the drillstring assembly 250 may be a bottom hole assembly (BHA).

The wellsite system 200 can provide for operation of the drillstring 225 and other operations. As shown, the wellsite system 200 includes the platform 211 and the derrick 214 positioned over the borehole 232. As mentioned, the wellsite system 200 can include the rotary table 220 where the drillstring 225 pass through an opening in the rotary table 220.

As shown in the example of FIG. 2, the wellsite system 200 can include the kelly 218 and associated components, etc., or a top drive 240 and associated components. As to a kelly example, the kelly 218 may be a square or hexagonal metal/alloy bar with a hole drilled therein that serves as a mud flow path. The kelly 218 can be used to transmit rotary motion from the rotary table 220 via the kelly drive bushing 219 to the drillstring 225, while allowing the drillstring 225 to be lowered or raised during rotation. The kelly 218 can pass through the kelly drive bushing 219, which can be driven by the rotary table 220. As an example, the rotary table 220 can include a master bushing that operatively couples to the kelly drive bushing 219 such that rotation of the rotary table 220 can turn the kelly drive bushing 219 and hence the kelly 218. The kelly drive bushing 219 can include an inside profile matching an outside profile (e.g., square, hexagonal, etc.) of the kelly 218; however, with slightly larger dimensions so that the kelly 218 can freely move up and down inside the kelly drive bushing 219.

As to a top drive example, the top drive 240 can provide functions performed by a kelly and a rotary table. The top drive 240 can turn the drillstring 225. As an example, the top drive 240 can include one or more motors (e.g., electric and/or hydraulic) connected with appropriate gearing to a short section of pipe called a quill, that in turn may be screwed into a saver sub or the drillstring 225 itself. The top drive 240 can be suspended from the traveling block 211, so the rotary mechanism is free to travel up and down the derrick 214. As an example, a top drive 240 may allow for drilling to be performed with more joint stands than a kelly/rotary table approach.

In the example of FIG. 2, the mud tank 201 can hold mud, which can be one or more types of drilling fluids. As an example, a wellbore may be drilled to produce fluid, inject fluid or both (e.g., hydrocarbons, minerals, water, etc.).

In the example of FIG. 2, the drillstring 225 (e.g., including one or more downhole tools) may be composed of a series of pipes threadably connected together to form a long tube with the drill bit 226 at the lower end thereof. As the drillstring 225 is advanced into a wellbore for drilling, at some point in time prior to or coincident with drilling, the mud may be pumped by the pump 204 from the mud tank 201 (e.g., or other source) via a the lines 206, 208 and 209 to a port of the kelly 218 or, for example, to a port of the top drive 240. The mud can then flow via a passage (e.g., or passages) in the drillstring 225 and out of ports located on the drill bit 226 (see, e.g., a directional arrow). As the mud exits the drillstring 225 via ports in the drill bit 226, it can then circulate upwardly through an annular region between an outer surface(s) of the drillstring 225 and surrounding wall(s) (e.g., open borehole, casing, etc.), as indicated by directional arrows. In such a manner, the mud lubricates the drill bit 226 and carries heat energy (e.g., frictional or other energy) and formation cuttings to the surface where the mud (e.g., and cuttings) may be returned to the mud tank 201, for example, for recirculation (e.g., with processing to remove cuttings, etc.).

The mud pumped by the pump 204 into the drillstring 225 may, after exiting the drillstring 225, form a mudcake that lines the wellbore which, among other functions, may reduce friction between the drillstring 225 and surrounding wall(s) (e.g., borehole, casing, etc.). A reduction in friction may facilitate advancing or retracting the drillstring 225. During a drilling operation, the entire drill string 225 may be pulled from a wellbore and optionally replaced, for example, with a new or sharpened drill bit, a smaller diameter drill string, etc. As mentioned, the act of pulling a drill string out of a hole or replacing it in a hole is referred to as tripping. A trip may be referred to as an upward trip or an outward trip or as a downward trip or an inward trip depending on trip direction.

As an example, consider a downward trip where upon arrival of the drill bit 226 of the drill string 225 at a bottom of a wellbore, pumping of the mud commences to lubricate the drill bit 226 for purposes of drilling to enlarge the wellbore. As mentioned, the mud can be pumped by the pump 204 into a passage of the drillstring 225 and, upon filling of the passage, the mud may be used as a transmission medium to transmit energy, for example, energy that may encode information as in mud-pulse telemetry.

As an example, mud-pulse telemetry equipment may include a downhole device configured to effect changes in pressure in the mud to create an acoustic wave or waves upon which information may modulated. In such an example, information from downhole equipment (e.g., one or more modules of the drillstring 225) may be transmitted uphole to an uphole device, which may relay such information to other equipment for processing, control, etc.

As an example, telemetry equipment may operate via transmission of energy via the drillstring 225 itself. For example, consider a signal generator that imparts coded energy signals to the drillstring 225 and repeaters that may receive such energy and repeat it to further transmit the coded energy signals (e.g., information, etc.).

As an example, the drillstring 225 may be fitted with telemetry equipment 252 that includes a rotatable drive shaft, a turbine impeller mechanically coupled to the drive shaft such that the mud can cause the turbine impeller to rotate, a modulator rotor mechanically coupled to the drive shaft such that rotation of the turbine impeller causes said modulator rotor to rotate, a modulator stator mounted adjacent to or proximate to the modulator rotor such that rotation of the modulator rotor relative to the modulator stator creates pressure pulses in the mud, and a controllable brake for selectively braking rotation of the modulator rotor to modulate pressure pulses. In such example, an alternator may be coupled to the aforementioned drive shaft where the alternator includes at least one stator winding electrically coupled to a control circuit to selectively short the at least one stator winding to electromagnetically brake the alternator and thereby selectively brake rotation of the modulator rotor to modulate the pressure pulses in the mud.

In the example of FIG. 2, an uphole control and/or data acquisition system 262 may include circuitry to sense pressure pulses generated by telemetry equipment 252 and, for example, communicate sensed pressure pulses or information derived therefrom for process, control, etc.

The assembly 250 of the illustrated example includes a logging-while-drilling (LWD) module 254, a measuring-while-drilling (MWD) module 256, an optional module 258, a roto-steerable system and motor 260, and the drill bit 226.

The LWD module 254 may be housed in a suitable type of drill collar and can contain one or a plurality of selected types of logging tools. It will also be understood that more than one LWD and/or MWD module can be employed, for example, as represented at by the module 256 of the drillstring assembly 250. Where the position of an LWD module is mentioned, as an example, it may refer to a module at the position of the LWD module 254, the module 256, etc. An LWD module can include capabilities for measuring, processing, and storing information, as well as for communicating with the surface equipment. In the illustrated example, the LWD module 254 may include a seismic measuring device.

The MWD module 256 may be housed in a suitable type of drill collar and can contain one or more devices for measuring characteristics of the drillstring 225 and the drill bit 226. As an example, the MWD tool 254 may include equipment for generating electrical power, for example, to power various components of the drillstring 225. As an example, the MWD tool 254 may include the telemetry equipment 252, for example, where the turbine impeller can generate power by flow of the mud; it being understood that other power and/or battery systems may be employed for purposes of powering various components. As an example, the MWD module 256 may include one or more of the following types of measuring devices: a weight-on-bit measuring device, a torque measuring device, a vibration measuring device, a shock measuring device, a stick slip measuring device, a direction measuring device, and an inclination measuring device.

FIG. 2 also shows some examples of types of holes that may be drilled. For example, consider a slant hole 272, an S-shaped hole 274, a deep inclined hole 276 and a horizontal hole 278.

As an example, a drilling operation can include directional drilling where, for example, at least a portion of a well includes a curved axis. For example, consider a radius that defines curvature where an inclination with regard to the vertical may vary until reaching an angle between about 30 degrees and about 60 degrees or, for example, an angle to about 90 degrees or possibly greater than about 90 degrees.

As an example, a directional well can include several shapes where each of the shapes may aim to meet particular operational demands. As an example, a drilling process may be performed on the basis of information as and when it is relayed to a drilling engineer. As an example, inclination and/or direction may be modified based on information received during a drilling process.

As an example, deviation of a bore may be accomplished in part by use of a downhole motor and/or a turbine. As to a motor, for example, a drillstring can include a positive displacement motor (PDM).

As an example, a system may be a steerable system and include equipment to perform method such as geosteering. As an example, a steerable system can include a PDM or of a turbine on a lower part of a drillstring which, just above a drill bit, a bent sub can be mounted. As an example, above a PDM, MWD equipment that provides real time or near real time data of interest (e.g., inclination, direction, pressure, temperature, real weight on the drill bit, torque stress, etc.) and/or LWD equipment may be installed. As to the latter, LWD equipment can make it possible to send to the surface various types of data of interest, including for example, geological data (e.g., gamma ray log, resistivity, density and sonic logs, etc.).

The coupling of sensors providing information on the course of a well trajectory, in real time or near real time, with, for example, one or more logs characterizing the formations from a geological viewpoint, can allow for implementing a geosteering method. Such a method can include navigating a subsurface environment, for example, to follow a desired route to reach a desired target or targets.

As an example, a drillstring can include an azimuthal density neutron (AND) tool for measuring density and porosity; a MWD tool for measuring inclination, azimuth and shocks; a compensated dual resistivity (CDR) tool for measuring resistivity and gamma ray related phenomena; one or more variable gauge stabilizers; one or more bend joints; and a geosteering tool, which may include a motor and optionally equipment for measuring and/or responding to one or more of inclination, resistivity and gamma ray related phenomena.

As an example, geosteering can include intentional directional control of a wellbore based on results of downhole geological logging measurements in a manner that aims to keep a directional wellbore within a desired region, zone (e.g., a pay zone), etc. As an example, geosteering may include directing a wellbore to keep the wellbore in a particular section of a reservoir, for example, to minimize gas and/or water breakthrough and, for example, to maximize economic production from a well that includes the wellbore.

Referring again to FIG. 2, the wellsite system 200 can include one or more sensors 264 that are operatively coupled to the control and/or data acquisition system 262. As an example, a sensor or sensors may be at surface locations. As an example, a sensor or sensors may be at downhole locations. As an example, a sensor or sensors may be at one or more remote locations that are not within a distance of the order of about one hundred meters from the wellsite system 200. As an example, a sensor or sensor may be at an offset wellsite where the wellsite system 200 and the offset wellsite are in a common field (e.g., oil and/or gas field).

As an example, one or more of the sensors 264 can be provided for tracking pipe, tracking movement of at least a portion of a drillstring, etc.

As an example, the system 200 can include one or more sensors 266 that can sense and/or transmit signals to a fluid conduit such as a drilling fluid conduit (e.g., a drilling mud conduit). For example, in the system 200, the one or more sensors 266 can be operatively coupled to portions of the standpipe 208 through which mud flows. As an example, a downhole tool can generate pulses that can travel through the mud and be sensed by one or more of the one or more sensors 266. In such an example, the downhole tool can include associated circuitry such as, for example, encoding circuitry that can encode signals, for example, to reduce demands as to transmission. As an example, circuitry at the surface may include decoding circuitry to decode encoded information transmitted at least in part via mud-pulse telemetry. As an example, circuitry at the surface may include encoder circuitry and/or decoder circuitry and circuitry downhole may include encoder circuitry and/or decoder circuitry. As an example, the system 200 can include a transmitter that can generate signals that can be transmitted downhole via mud (e.g., drilling fluid) as a transmission medium.

As an example, one or more portions of a drillstring may become stuck. The term stuck can refer to one or more of varying degrees of inability to move or remove a drillstring from a bore. As an example, in a stuck condition, it might be possible to rotate pipe or lower it back into a bore or, for example, in a stuck condition, there may be an inability to move the drillstring axially in the bore, though some amount of rotation may be possible. As an example, in a stuck condition, there may be an inability to move at least a portion of the drillstring axially and rotationally.

As to the term "stuck pipe", the can refer to a portion of a drillstring that cannot be rotated or moved axially. As an example, a condition referred to as "differential sticking" can be a condition whereby the drillstring cannot be moved (e.g., rotated or reciprocated) along the axis of the bore. Differential sticking may occur when high-contact forces caused by low reservoir pressures, high wellbore pressures, or both, are exerted over a sufficiently large area of the drillstring. Differential sticking can have time and financial cost.

As an example, a sticking force can be a product of the differential pressure between the wellbore and the reservoir and the area that the differential pressure is acting upon. This means that a relatively low differential pressure (delta p) applied over a large working area can be just as effective in sticking pipe as can a high differential pressure applied over a small area.

As an example, a condition referred to as "mechanical sticking" can be a condition where limiting or prevention of motion of the drillstring by a mechanism other than differential pressure sticking occurs. Mechanical sticking can be caused, for example, by one or more of junk in the hole, wellbore geometry anomalies, cement, keyseats or a buildup of cuttings in the annulus.

Figure 3:
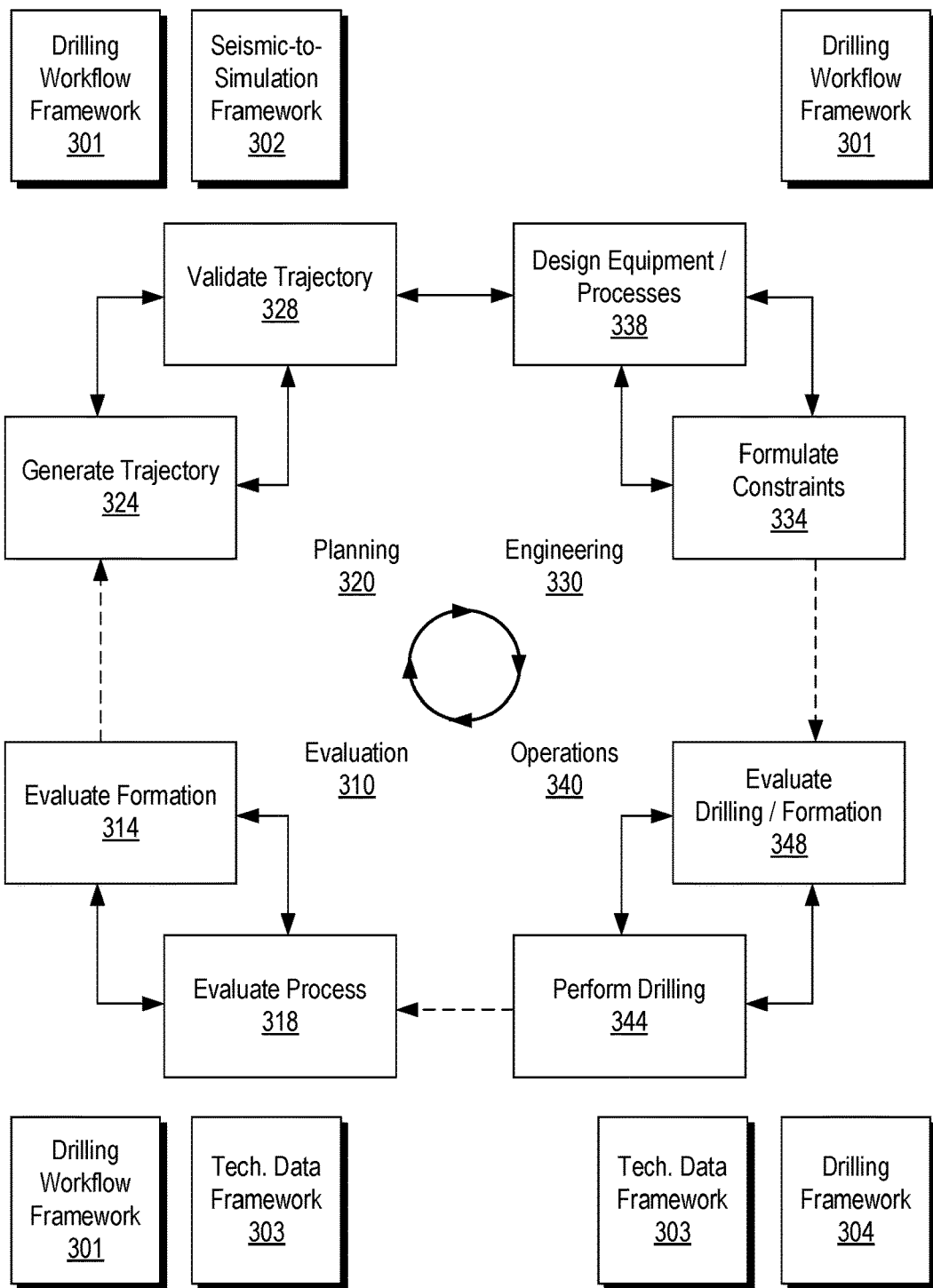
FIG. 3 illustrates an example of a system.

FIG. 3 shows an example of a system 300 that includes various equipment for evaluation 310, planning 320, engineering 330 and operations 340. For example, a drilling workflow framework 301, a seismic-to-simulation framework 302, a technical data framework 303 and a drilling framework 304 may be implemented to perform one or more processes such as a evaluating a formation 314, evaluating a process 318, generating a trajectory 324, validating a trajectory 328, formulating constraints 334, designing equipment and/or processes based at least in part on constraints 338, performing drilling 344 and evaluating drilling and/or formation 348.

In the example of FIG. 3, the seismic-to-simulation framework 302 can be, for example, the PETREL® framework (Schlumberger Limited, Houston, Tex.) and the technical data framework 302 can be, for example, the TECHLOG® framework (Schlumberger Limited, Houston, Tex.).

As an example, a framework can include entities that may include earth entities, geological objects or other objects such as wells, surfaces, reservoirs, etc. Entities can include virtual representations of actual physical entities that are reconstructed for purposes of one or more of evaluation, planning, engineering, operations, etc.

Entities may include entities based on data acquired via sensing, observation, etc. (e.g., seismic data and/or other information). An entity may be characterized by one or more properties (e.g., a geometrical pillar grid entity of an earth model may be characterized by a porosity property). Such properties may represent one or more measurements (e.g., acquired data), calculations, etc.

A framework may be an object-based framework. In such a framework, entities may include entities based on predefined classes, for example, to facilitate modeling, analysis, simulation, etc. A commercially available example of an object-based framework is the MICROSOFT™ .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

As an example, a framework can include an analysis component that may allow for interaction with a model or model-based results (e.g., simulation results, etc.). As to simulation, a framework may operatively link to or include a simulator such as the ECLIPSE® reservoir simulator (Schlumberger Limited, Houston Tex.), the INTERSECT® reservoir simulator (Schlumberger Limited, Houston Tex.), etc.

The aforementioned PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, well engineers, reservoir engineers, etc.) can develop collaborative workflows and integrate operations to streamline processes. Such a framework may be considered an application and may be considered a data-driven application (e.g., where data is input for purposes of modeling, simulating, etc.).

As an example, one or more frameworks may be interoperative and/or run upon one or another. As an example, consider the commercially available framework environment marketed as the OCEAN® framework environment (Schlumberger Limited, Houston, Tex.), which allows for integration of add-ons (or plug-ins) into a PETREL® framework workflow. The OCEAN® framework environment leverages .NET™ tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

As an example, a framework can include a model simulation layer along with a framework services layer, a framework core layer and a modules layer. The framework may include the commercially available OCEAN® framework where the model simulation layer can include or operatively link to the commercially available PETREL® model-centric software package that hosts OCEAN® framework applications. In an example embodiment, the PETREL® software may be considered a data-driven application. The PETREL® software can include a framework for model building and visualization. Such a model may include one or more grids.

As an example, the model simulation layer may provide domain objects, act as a data source, provide for rendering and provide for various user interfaces. Rendering may provide a graphical environment in which applications can display their data while the user interfaces may provide a common look and feel for application user interface components.

As an example, domain objects can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

As an example, data may be stored in one or more data sources (or data stores, generally physical data storage devices), which may be at the same or different physical sites and accessible via one or more networks. As an example, a model simulation layer may be configured to model projects. As such, a particular project may be stored where stored project information may include inputs, models, results and cases. Thus, upon completion of a modeling session, a user may store a project. At a later time, the project can be accessed and restored using the model simulation layer, which can recreate instances of the relevant domain objects.

As an example, the system 300 may be used to perform one or more workflows. A workflow may be a process that includes a number of worksteps. A workstep may operate on data, for example, to create new data, to update existing data, etc. As an example, a workflow may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable at least in part in the PETREL® software, for example, that operates on seismic data, seismic attribute(s), etc.

As an example, seismic data can be data acquired via a seismic survey where sources and receivers are positioned in a geologic environment to emit and receive seismic energy where at least a portion of such energy can reflect off subsurface structures. As an example, a seismic data analysis framework or frameworks (e.g., consider the OMEGA® framework, marketed by Schlumberger Limited, Houston, Tex.) may be utilized to determine depth, extent, properties, etc. of subsurface structures. As an example, seismic data analysis can include forward modeling and/or inversion, for example, to iteratively build a model of a subsurface region of a geologic environment. As an example, a seismic data analysis framework may be part of or operatively coupled to a seismic-to-simulation framework (e.g., the PETREL® framework, etc.).

As an example, a workflow may be a process implementable at least in part in the OCEAN® framework. As an example, a workflow may include one or more worksteps that access a module such as a plug-in (e.g., external executable code, etc.).

As an example, a framework may provide for modeling petroleum systems. For example, the commercially available modeling framework marketed as the PETROMOD® framework (Schlumberger Limited, Houston, Tex.) includes features for input of various types of information (e.g., seismic, well, geological, etc.) to model evolution of a sedimentary basin. The PETROMOD® framework provides for petroleum systems modeling via input of various data such as seismic data, well data and other geological data, for example, to model evolution of a sedimentary basin. The PETROMOD® framework may predict if, and how, a reservoir has been charged with hydrocarbons, including, for example, the source and timing of hydrocarbon generation, migration routes, quantities, pore pressure and hydrocarbon type in the subsurface or at surface conditions. In combination with a framework such as the PETREL® framework, workflows may be constructed to provide basin-to-prospect scale exploration solutions. Data exchange between frameworks can facilitate construction of models, analysis of data (e.g., PETROMOD® framework data analyzed using PETREL® framework capabilities), and coupling of workflows.

As mentioned, a drillstring can include various tools that may make measurements. As an example, a wireline tool or another type of tool may be utilized to make measurements. As an example, a tool may be configured to acquire electrical borehole images. As an example, the fullbore Formation MicroImager (FMI) tool (Schlumberger Limited, Houston, Tex.) can acquire borehole image data. A data acquisition sequence for such a tool can include running the tool into a borehole with acquisition pads closed, opening and pressing the pads against a wall of the borehole, delivering electrical current into the material defining the borehole while translating the tool in the borehole, and sensing current remotely, which is altered by interactions with the material.

Analysis of formation information may reveal features such as, for example, vugs, dissolution planes (e.g., dissolution along bedding planes), stress-related features, dip events, etc. As an example, a tool may acquire information that may help to characterize a reservoir, optionally a fractured reservoir where fractures may be natural and/or artificial (e.g., hydraulic fractures). As an example, information acquired by a tool or tools may be analyzed using a framework such as the TECHLOG® framework. As an example, the TECHLOG® framework can be interoperable with one or more other frameworks such as, for example, the PETREL® framework.

Figure 4:
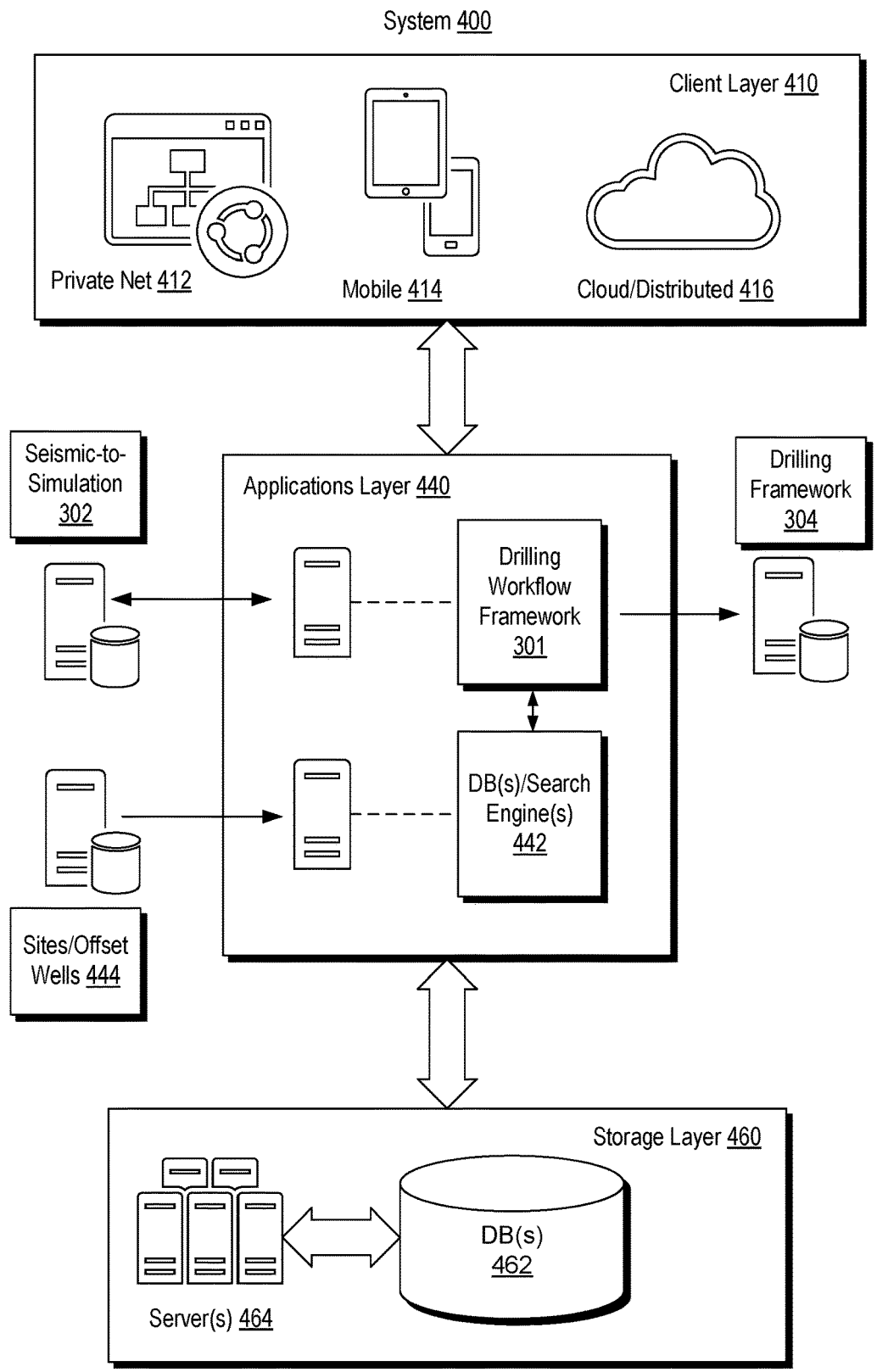
FIG. 4 illustrates an example of a system.

FIG. 4 shows an example of a system 400 that includes a client layer 410, an applications layer 440 and a storage layer 460. As shown the client layer 410 can be in communication with the applications layer 440 and the applications layer 440 can be in communication with the storage layer 460.

The client layer 410 can include features that allow for access and interactions via one or more private networks 412, one or more mobile platforms and/or mobile networks 414 and via the "cloud" 416, which may be considered to include distributed equipment that forms a network such as a network of networks.

In the example of FIG. 4, the applications layer 440 includes the drilling workflow framework 301 as mentioned with respect to the example of FIG. 3. The applications layer 440 also includes a database management component 442 that includes one or more search engines modules.

As an example, the database management component 442 can include one or more search engine modules that provide for searching one or more information that may be stored in one or more data repositories. As an example, the STUDIO E&P™ knowledge environment (Schlumberger Ltd., Houston, Tex.) includes STUDIO FIND™ search functionality, which provides a search engine. The STUDIO FIND™ search functionality also provides for indexing content, for example, to create one or more indexes. As an example, search functionality may provide for access to public content, private content or both, which may exist in one or more databases, for example, optionally distributed and accessible via an intranet, the Internet or one or more other networks. As an example, a search engine may be configured to apply one or more filters from a set or sets of filters, for example, to enable users to filter out data that may not be of interest.

As an example, a framework may provide for interaction with a search engine and, for example, associated features such as features of the STUDIO FIND™ search functionality. As an example, a framework may provide for implementation of one or more spatial filters (e.g., based on an area viewed on a display, static data, etc.). As an example, a search may provide access to dynamic data (e.g., "live" data from one or more sources), which may be available via one or more networks (e.g., wired, wireless, etc.). As an example, one or more modules may optionally be implemented within a framework or, for example, in a manner operatively coupled to a framework (e.g., as an add-on, a plug-in, etc.). As an example, a module for structuring search results (e.g., in a list, a hierarchical tree structure, etc.) may optionally be implemented within a framework or, for example, in a manner operatively coupled to a framework (e.g., as an add-on, a plug-in, etc.).

In the example of FIG. 4, the applications layer 440 can include communicating with one or more resources such as, for example, the seismic-to-simulation framework 302, the drilling framework 304 and/or one or more sites, which may be or include one or more offset wellsites 444. As an example, the applications layer 440 may be implemented for a particular wellsite where information can be processed as part of a workflow for operations such as, for example, operations performed, being performed and/or to be performed at the particular wellsite. As an example, an operation may involve directional drilling, for example, via geosteering.

In the example of FIG. 4, the storage layer 460 can include various types of data, information, etc., which may be stored in one or more databases 462. As an example, one or more servers 464 may provide for management, access, etc., to data, information, etc., stored in the one or more databases 462. As an example, the module 442 may provide for searching as to data, information, etc., stored in the one or more databases 462.

As an example, the module 442 may include features for indexing, etc. As an example, information may be indexed at least in part with respect to wellsite. For example, where the applications layer 440 is implemented to perform one or more workflows associated with a particular wellsite, data, information, etc., associated with that particular wellsite may be indexed based at least in part on the wellsite being an index parameter (e.g., a search parameter).

As an example, the system 400 of FIG. 4 may be implemented to perform one or more portions of one or more workflows associated with the system 300 of FIG. 3. For example, the drilling workflow framework 301 may interact with the technical data framework 303 and the drilling framework 304 before, during and/or after performance of one or more drilling operations. In such an example, the one or more drilling operations may be performed in a geologic environment (see, e.g., the environment 150 of FIG. 1) using one or more types of equipment (see, e.g., equipment of FIGS. 1 and 2).

As an example, a method can include establishing an Internet of Things (IoT) hub or hubs. As an example, such a hub or hubs can include one or more device registries. In such an example, the hub or hubs may provide for storage of metadata associated with a device and, for example, a per-device authentication model. As an example, where location information indicates that a device (e.g., wellsite equipment, etc.) has been changed with respect to its location, a method can include revoking the device in a hub.

As an example, such an architecture utilized in a system may include features of the AZURE™ architecture (Microsoft Corporation, Redmond, Wash.). As an example, a cloud portal block can include one or more features of an AZURE™ portal that can manage, mediate, etc. access to one or more services, data, connections, networks, devices, etc.

As an example, a system can include a cloud computing platform and infrastructure, for example, for building, deploying, and managing applications and services (e.g., through a network of datacenters, etc.). As an example, such a cloud platform may provide PaaS and IaaS services and support one or more different programming languages, tools and frameworks, etc.

Figure 5:
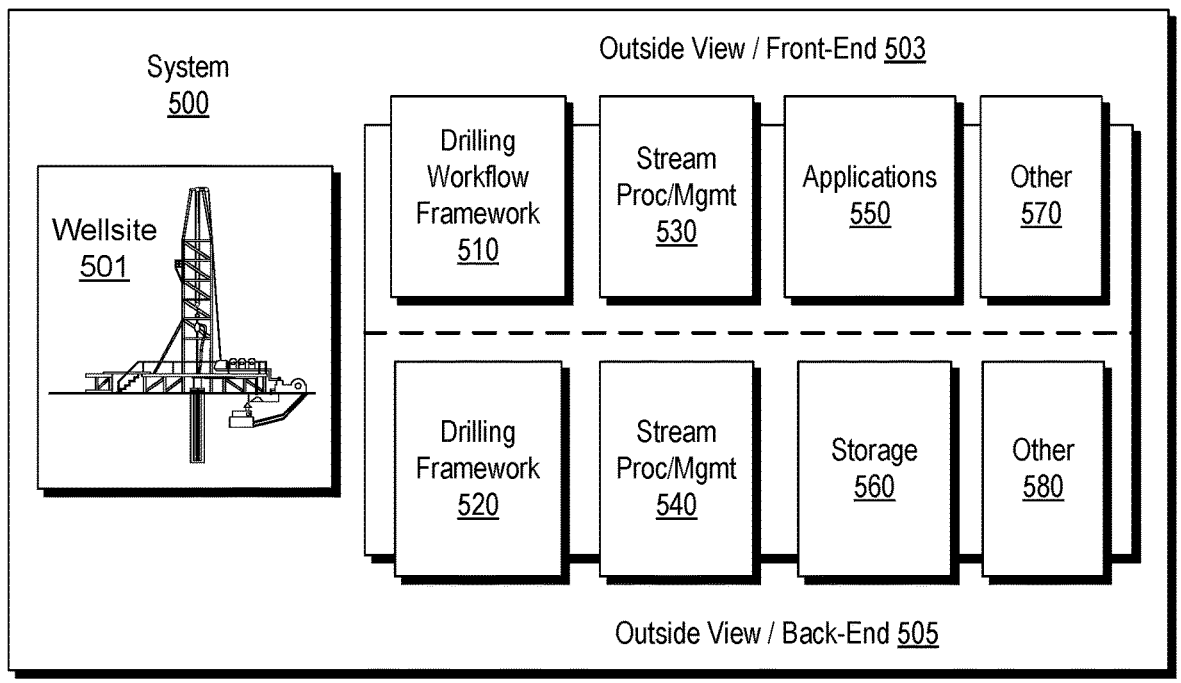
FIG. 5 illustrates an example of a system and an example of a scenario.
Figure 5:
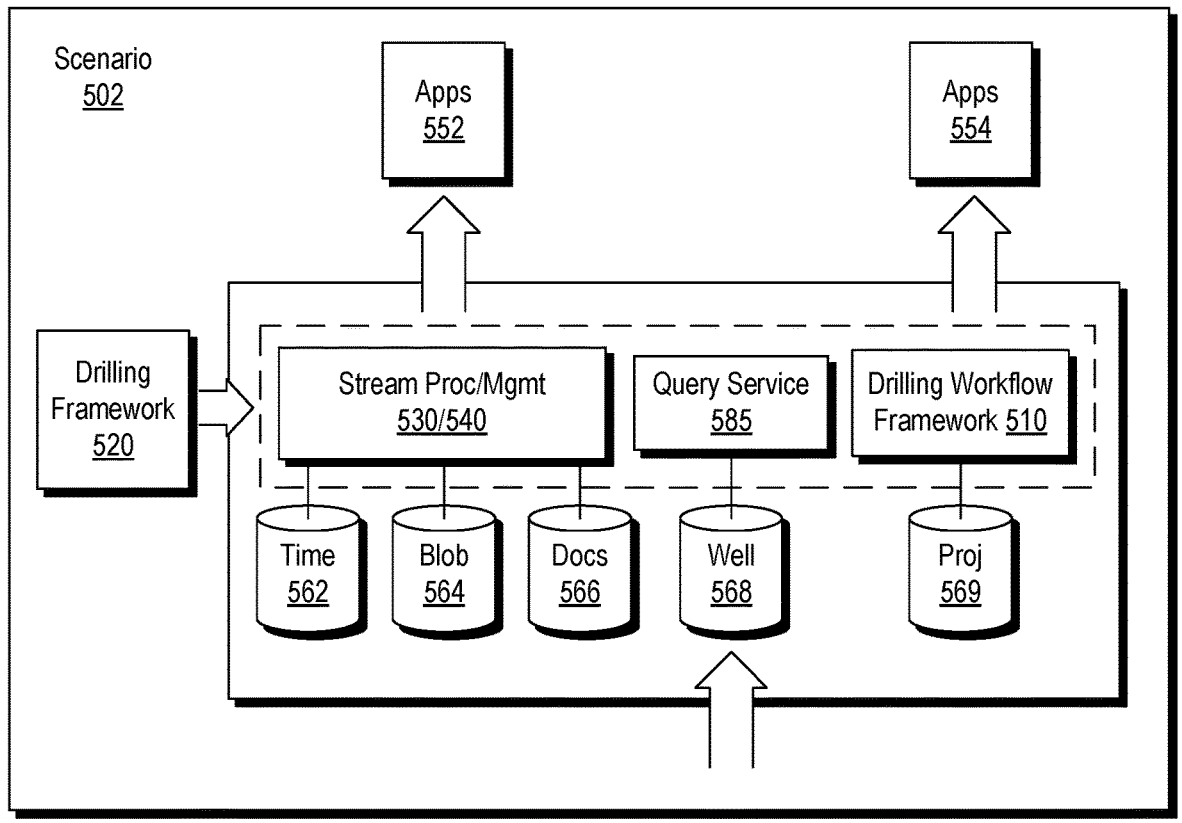

FIG. 5 shows an example of a system 500 associated with an example of a wellsite system 501 and also shows an example scenario 502. As shown in FIG. 5, the system 500 can include a front-end 503 and a back-end 505 from an outside or external perspective (e.g., external to the wellsite system 501, etc.). In the example of FIG. 5, the system 500 includes a drilling framework 520, a stream processing and/or management block 540, storage 560 and optionally one or more other features 580 that can be defined as being back-end features. In the example of FIG. 5, the system 500 includes a drilling workflow framework 510, a stream processing and/or management block 530, applications 550 and optionally one or more other features 570 that can be defined as being front-end features.

As an example, a user operating a user device can interact with the front-end 503 where the front-end 503 can interact with one or more features of the back-end 505. As an example, such interactions may be implemented via one or more networks, which may be associated with a cloud platform (e.g., cloud resources, etc.).

As to the example scenario 502, the drilling framework 520 can provide information associated with, for example, the wellsite system 501. As shown, the stream blocks 530 and 540, a query service 585 and the drilling workflow framework 510 may receive information and direct such information to storage, which may include a time series database 562, a blob storage database 564, a document database 566, a well information database 568, a project(s) database 569, etc. As an example, the well information database 568 may receive and store information such as, for example, customer information (e.g., from entities that may be owners of rights at a wellsite, service providers at a wellsite, etc.). As an example, the project database 569 can include information from a plurality of projects where a project may be, for example, a wellsite project. As shown, output can be to one or more applications 552 and 554.

As an example, the system 500 can be operable for a plurality of wellsite, which may include active and/or inactive wellsites and/or, for example, one or more planned wellsites. As an example, the system 500 can include various components of the system 300 of FIG. 3. As an example, the system 500 can include various components of the system 400 of FIG. 4. For example, the drilling workflow framework 510 can be a drilling workflow framework such as the drilling workflow framework 301 and/or, for example, the drilling framework 520 can be a drilling framework such as the drilling framework 304.

Figure 6:
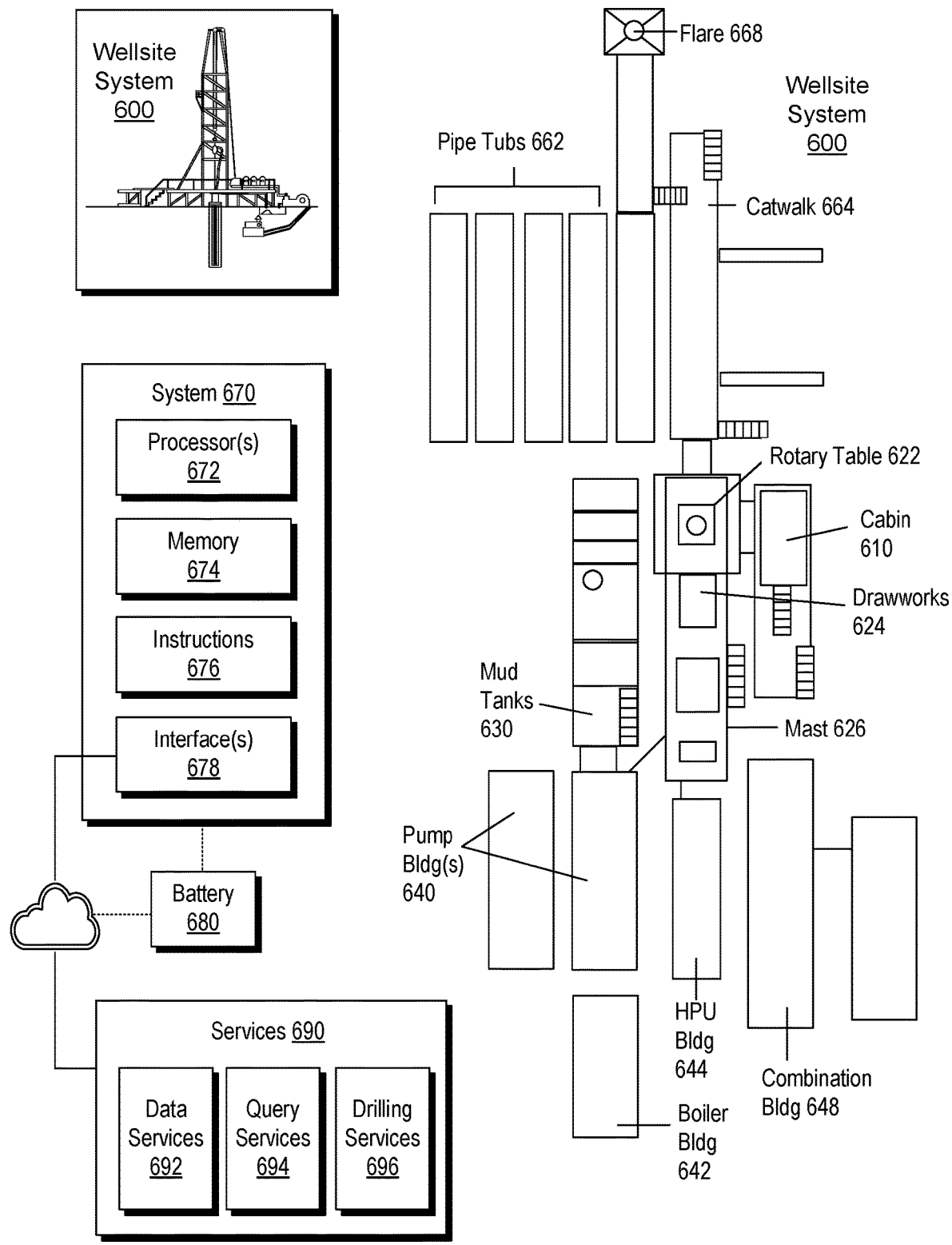
FIG. 6 illustrates an example of a wellsite system.

FIG. 6 shows an example of a wellsite system 600, specifically, FIG. 6 shows the wellsite system 600 in an approximate side view and an approximate plan view along with a block diagram of a system 670.

In the example of FIG. 6, the wellsite system 600 can include a cabin 610, a rotary table 622, drawworks 624, a mast 626 (e.g., optionally carrying a top drive, etc.), mud tanks 630 (e.g., with one or more pumps, one or more shakers, etc.), one or more pump buildings 640, a boiler building 642, an HPU building 644 (e.g., with a rig fuel tank, etc.), a combination building 648 (e.g., with one or more generators, etc.), pipe tubs 662, a catwalk 664, a flare 668, etc. Such equipment can include one or more associated functions and/or one or more associated operational risks, which may be risks as to time, resources, and/or humans.

As shown in the example of FIG. 6, the wellsite system 600 can include a system 670 that includes one or more processors 672, memory 674 operatively coupled to at least one of the one or more processors 672, instructions 676 that can be, for example, stored in the memory 674, and one or more interfaces 678. As an example, the system 670 can include one or more processor-readable media that include processor-executable instructions executable by at least one of the one or more processors 672 to cause the system 670 to control one or more aspects of the wellsite system 600. In such an example, the memory 674 can be or include the one or more processor-readable media where the processor-executable instructions can be or include instructions. As an example, a processor-readable medium can be a computer-readable storage medium that is not a signal and that is not a carrier wave.

FIG. 6 also shows a battery 680 that may be operatively coupled to the system 670, for example, to power the system 670. As an example, the battery 680 may be a back-up battery that operates when another power supply is unavailable for powering the system 670. As an example, the battery 680 may be operatively coupled to a network, which may be a cloud network. As an example, the battery 680 can include smart battery circuitry and may be operatively coupled to one or more pieces of equipment via a SMBus or other type of bus.

In the example of FIG. 6, services 690 are shown as being available, for example, via a cloud platform. Such services can include data services 692, query services 694 and drilling services 696. As an example, the services 690 may be part of a system such as the system 300 of FIG. 3, the system 400 of FIG. 4 and/or the system 500 of FIG. 5.

As an example, a workflow can include performing various actions associated with well planning (e.g., planning a well). For example, consider actions associated with planning a well trajectory. As an example, a system can include instructions that are executable to render one or more graphical user interfaces (GUIs) to a display where such one or more GUIs can be utilized to interact with the system for well planning. In such an example, a view may change responsive to selection of a graphical element of a GUI where such a selection may cause a local application and/or a remote application to change the view. A change in a view can include rendering one or more graphical elements, which may include graphical controls, graphical alerts, etc. As an example, a workflow may be guided by views of a plurality of graphical user interfaces where the workflow may be performed by one or more individuals, for example, at least in part in series, optionally at least in part in parallel, etc.

Figure 7:
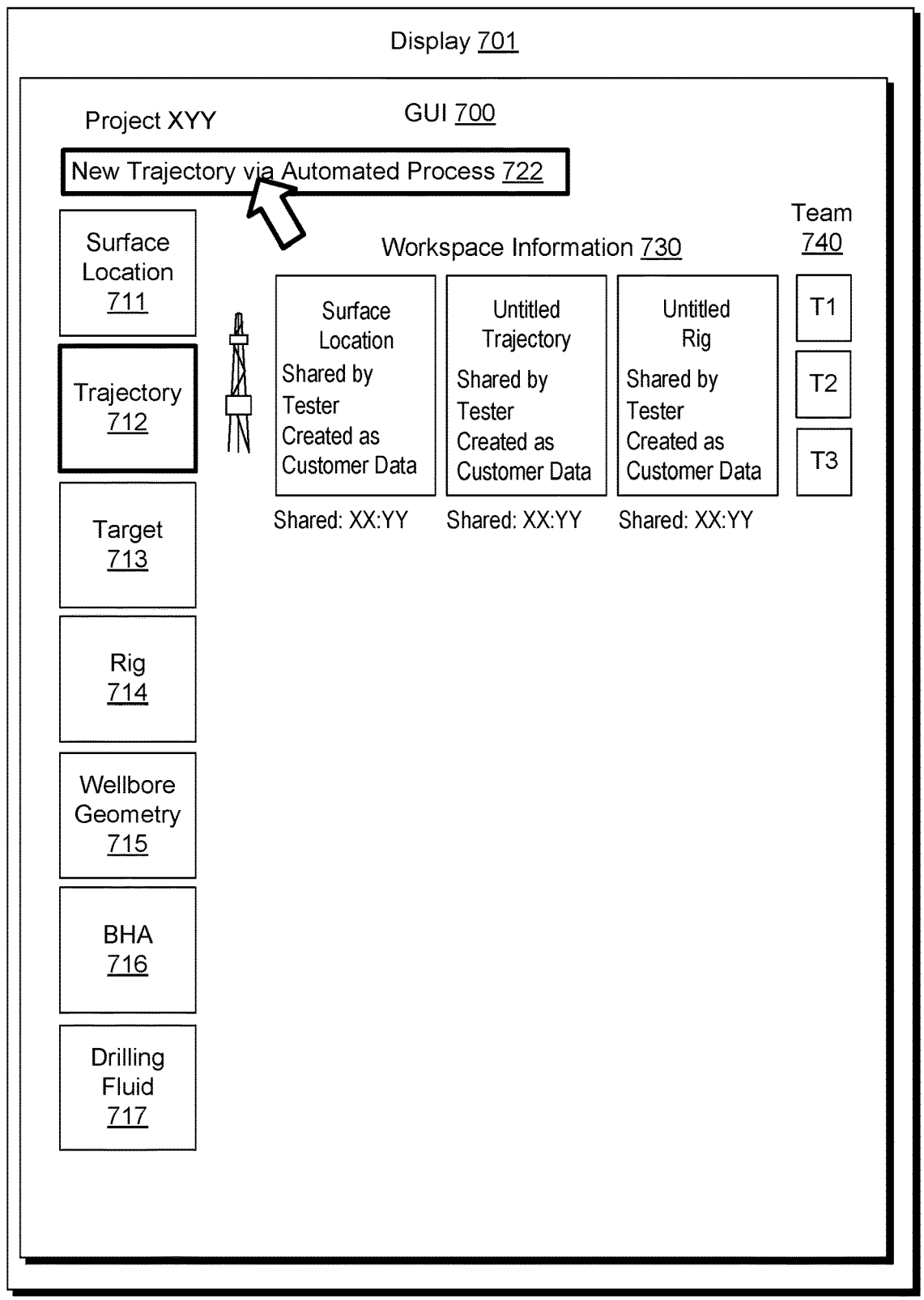
FIG. 7 illustrates an example of a graphical user interface rendered to a display.

FIG. 7 shows an example of a graphical user interface 700 as rendered to a display 701. As shown in the example of FIG. 7, the GUI 700 includes graphical elements 711, 712, 713, 714, 715, 716 and 717 that can be selectable graphical elements (e.g., graphical controls) that upon selection cause the GUI 700 to alter its view. For example, upon receipt of input that selects the trajectory graphical element 712, a system can respond (e.g., via local and/or remote executions of code, etc.) by rendering a graphical element 722 that can prompt a user to commence a workflow that plans a new trajectory via an automated process, which may be a semi-automated process as options may exist to intervene during such a process.

In the example of FIG. 7, the GUI 700 includes a workspace where workspace information 730 can be rendered and a team space 740 where visual representations of various team members may be rendered. As shown, the workspace information 730 can include information as to a surface location, an untitled trajectory, an untitled rig, etc. As an example, the untitled trajectory and the untitled rig may be "boxes" for further development as to a trajectory that is to extend from the surface location. As shown, the graphical element 711 corresponds to a surface location while the graphical element 714 corresponds to a rig. Such graphical elements can be associated with one or more other graphical elements. For example, where input is received to select the graphical element 712, a system can render associated information in the workspace as the workspace information 730, which may help to guide one or more user along a workflow or workflows.

In the example of FIG. 7, receipt of input (e.g., via an input mechanism of a computing device, etc.) can select the graphical element 722 and cause rendering of one or more views to the GUI 700 and/or to another GUI or GUIs to commence the automated process.

Figure 8:
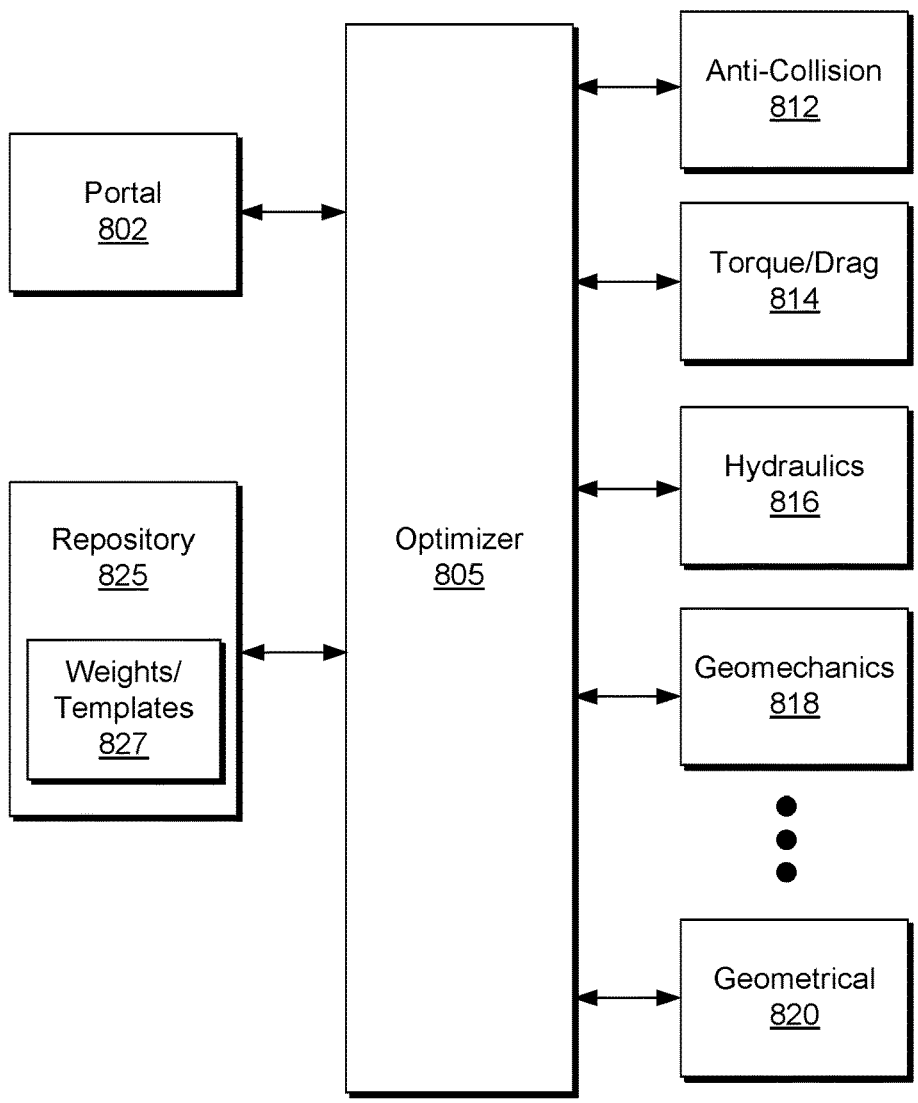
FIG. 8 illustrates an example of a system and an example of a method.
Figure 8:
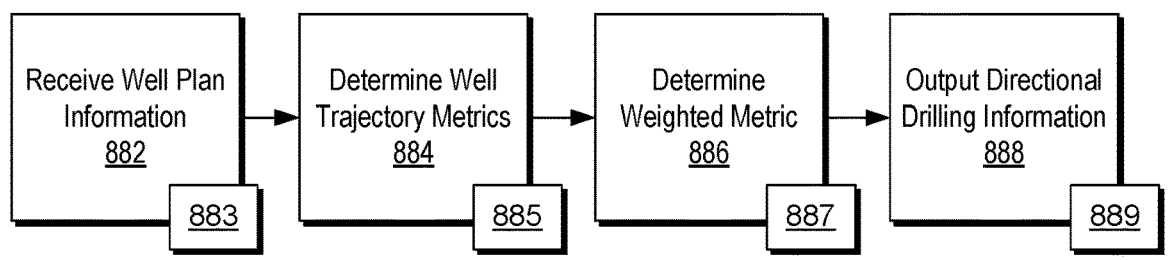

FIG. 8 shows an example of a system 800 and an example of a method 880. As shown, the system 800 can include a portal 802, an optimizer 805, an anti-collision block 812, a torque and/or drag block 814, a hydraulics block 816, a geomechanics block 818 and a geometrical metrics block 820; noting that more or fewer blocks may be included in such a system.

As an example, a system may include various metrics that may be considered to be well trajectory metrics. For example, consider a system that allows for selection (e.g., manual and/or automatic) of one or more metrics from a group of metrics that includes a geometrical metric, an anti-collision metric, a friction metric, a geomechanical metric and a hydraulics metric. As an example, a geometrical metric can be, for example, a curvature, a length, a depth, etc. For example, consider a maximum curvature metric, a total length metric, a depth at which a well trajectory deviates from vertical (e.g., a first deviation that may be considered to be a kickoff point from vertical). As an example, diverting a well trajectory from one direction to another can be referred to as kicking off. As an example, a well trajectory may be defined in part by one or more kickoff points (KOPs).

As an example, a geometrical metric may indicate whether a well trajectory comports with one or more geometrical criteria. For example, drilling equipment for directional drilling may be limited as to build, angle, etc. As an example, a geometrical metric may indicate contact with a layer of a geologic environment and, for example, an amount of contact, a type of contact, etc. For example, consider a bend that occurs over a range of depths where the range of depths corresponds to one or more layers of material in a geologic environment. As an example, a bend (e.g., curvature) may be limited in one or more such layers as to one or more other effects (e.g., stability, drillability, flow of cuttings, etc.). As an example, geometrical metrics may pertain to diameter of a bore or diameters of a bore.

As an example, a geometrical metric may relate to an assurance that given a start point (e.g., wellhead) that a target is reached (e.g., reservoir target) via a well trajectory that is within feasible limits imposed via directional drilling technology (e.g., depth, length, bend, kickoff, etc.).

As an example, a geometrical metric may indicate a general ease of drillability, for example, along a spectrum from "easy" to "difficult" given equipment and/or techniques for directional drilling. As an example, an "ideal" drillable trajectory may be characterized by one or more factors (e.g., curvature or bend, kickoff, etc.). As an example, a geometrical metric may be a value that indicates deviation from an ideal (e.g., or correspondence with an ideal).

As an example, a geometrical metric or geometrical metrics may be weighted by one or more weights. In such an example, a weighted metric may be determined, which may be a score or a portion of a score. As an example, a weighted metric may be based on a plurality of individually weighted metrics, for example, per one or more of the blocks 812, 814, 816, 818 and 820 of the system 800 of FIG. 8.

In the example of FIG. 8, the system 800 also includes a repository 825 that can store weights and/or templates 827 that can be utilized in a process. For example, the system 800 can execute instructions as may be included in various blocks to optimize a trajectory of a well at least in part according to information in the repository 825. As an example, the weights and/or templates 827 can be based on one or more of historical information, modeling, customization, etc.

In the example of FIG. 8, the portal 802 can be linked to a component of a graphical user interface such as, for example, the graphical user interface 700 of FIG. 7. For example, interactions via a GUI or GUIs may be linked to one or more components of the system 800. For example, a workflow can include transmitting and receiving information via a portal that is operatively coupled to the optimizer 805 (e.g., directly or indirectly). Such an operative coupling may be via circuitry of a device or a system and/or via one or more networks.

As an example, the optimizer 805 may be triggered via input received through a GUI rendered to a display of a computing device or operatively coupled to a computing device. Once triggered, the optimizer 805 can include mediating a process that seeks to output an optimized well trajectory. In such an example, the process can be automated, optionally with one or more opportunities to intervene. As an example, intervention may include selection and/or adjustment as to one or more of the weights and/or templates 827, selection and/or adjustment as to one or more of the blocks 812, 814, 816, 818 and 820.

As an example, an automated process for outputting a well trajectory as performed via the system 800 may be executable using one or more computing devices in a period of time that is less than approximately 10 minutes. Thus, for example, a user may select an option via a GUI rendered to a display and cause the system 800 to output an optimized well trajectory in about 10 minutes or less. As an example, the system 800 may output an optimized well trajectory in about 5 minutes or less (e.g., depending on the computing resources, etc. associated with the system 800).

As to the rapidity of the system 800 in outputting a well trajectory, the organization of the blocks can allow for the blocks to operate independently and optionally in parallel. As an example, each of the blocks can output a metric or metrics that can be weighted according to one or more weights in the repository 825, as may be received by the optimizer 805. In such an example, the optimizer 805 can weight metrics and generate an overall metric that can be compared to one or more other overall metrics (e.g., previously determined, simultaneously determined, etc.) to output an optimized well trajectory or, for example, to perform one or more additional iterations.

As an example, output from one iteration may be used as a starting point for a subsequent iteration. As an example, an iteration can include generating a plurality of overall output metrics for a plurality of possible well trajectories or, for example, an iteration can include generating a single output metric for one possible well trajectory. As an example, a plurality of possible well trajectories or a single possible well trajectory may be utilized for a subsequent iteration as to another single possible well trajectory or as to another plurality of possible well trajectories.

As an example, the block 812, 814, 816, 818 and 820 can be selectable, for example, via the optimizer 805 and/or via the portal 802. As an example, the blocks can include associated code (e.g., processor-executable instructions). As an example, such code can be executed such that one or more algorithms receive input information and output one or more metrics. As an example, the blocks may be of differing complexity with respect to their one or more respective algorithms. In such an example, given approximately the same computing resources, the blocks may output metrics at different times. For example, one block may be more rapid than another block. As an example, a fast block may output a metric in less than about 10 seconds while a slow block may output a metric in about a minute. As an example, the anti-collision block 812 can include algorithms of more complexity as multidimensional geometries may be assessed to determine risk of actual and/or potential collision of a well trajectory with another well trajectory and/or one or more other obstacles. As an example, the torque and/or drag block 814 can be a relatively fast block compared to the anti-collision block 812 where, for example, it may output one or more metrics in a matter of seconds.

As an example, the system 800 of FIG. 8 can be suitable for use in a workflow or workflows where well trajectories are to be generated that account for one or more different types of physical phenomena. In such an example, the system 800 can be suitable for rapid generation of such well trajectories, which may be considered to be refined or optimized well trajectories (e.g., compared to an initial input trajectory).

As an example, a system can process information iteratively to quickly determine detailed well trajectories. As an example, a system may be structured to perform processing at least in part in parallel, for example, for blocks and/or for multiple instances of an optimizer and blocks. As an example, a system may perform an iteration in a matter of about 10 seconds or less where such an iteration can output an overall metric that can be compared to one or more other overall metrics to determine whether a well trajectory is an optimized well trajectory. As an example, where collision is a factor and the anti-collision block 812 selected, an iteration may be longer, for example, of the order of minutes per iteration. As an example, the system 800 may be configured to be expected to output an optimized trajectory in about a minute to a few minutes as to a single well trajectory and in a longer period of time for multiple trajectories (e.g., from a common pad, etc.).

As an example, input to a system can include wellhead and target locations and data for various blocks, which may be accessed, loaded, etc. for a particular wellsite/plan.

As an example, one or more GUIs can be rendered to one or more display that can allow for managing a method, a workflow, editing (e.g., with team involvement as desired), etc.

In the example of FIG. 8, the method 880 includes a reception block 882 for receiving well plan information that includes a reservoir target associated with a reservoir of a subterranean environment; a determination block 884 for, based at least in part on characteristics of the subterranean environment, determining well trajectory metrics that include a geometrical metric; a determination block 886 for determining a weighted metric based at least in part on weighting of the well trajectory metrics; and an output block 888 for, based at least in part on an assessment of the weighted metric, outputting directional drilling information for a well trajectory to the reservoir target. In such an example, an assessment can include comparing the weighted metric to one or more other weighted metrics. As an example, the weighted metric can be a summation of individually weighted values for each of the well trajectory metrics. As an example, a method can include repeating determining based at least in part on an assessment of a weighted metric. As an example, a weighted metric may be a score, which may indicate a suitability and/or a rank with respect to another possible well trajectory.

The method 800 is shown in FIG. 8 in association with various computer-readable media (CRM) blocks 883, 885, 887 and 889. Such blocks generally include instructions suitable for execution by one or more processors (or cores) to instruct a computing device or system to perform one or more actions. While various blocks are shown, a single medium may be configured with instructions to allow for, at least in part, performance of various actions of the method 800. As an example, a computer-readable medium (CRM) may be a computer-readable storage medium that is non-transitory and not a carrier wave. As an example, the blocks 883, 885, 887 and 889 may be provided as one or more modules, for example, such as the one or more modules and/or instructions 1302 of the system 1300 of FIG. 13.

As an example, well trajectory metrics can include an anti-collision metric. As an example, a method can include determining well trajectory metrics at least in part via parallel processing.

As an example, the torque and/or drag block 814 can account for friction. As an example, friction may be desired to be minimal, as keeping it low can help to increase weight on a drill bit. As an example, a shape of a well trajectory can help to minimize friction as it may be desirable for drillpipe to "fall down" by keeping friction with a bore wall to a minimum (e.g., to help to avoid sticking; avoid stuck pipe during a field operation).

As an example, a block may consider fluid mechanics (e.g., hydraulics, etc.). For example, the hydraulics block 816 may consider angle of a well trajectory as to transport of cutting. For example, will cuttings fall to bottom, will cuttings collect at a bend, etc. As an example, such a block may consider time at a particular portion of a trajectory during drilling and may weight a metric or metrics to avoid or minimize an amount of time drilling at an angle that may be detrimental to transport of cutting (e.g., increase risk of one or more issues, etc.).

As an example, a block may consider pore pressure. For example, the geomechanics block 818 may consider pore pressure with respect to borehole collapse and stability. As an example, stability can depend on direction (NS/EW) a trajectory takes within a geologic environment, which may be considered by an algorithm or algorithms of the geomechanics block 818. As an example, such a block may receive information as to characteristics of one or more portions of a geologic environment. For example, consider isotropy, anisotropy, harmonic window, pore pressure being in a reasonable range, maximization of pore pressure window, core and fracture pressure of formation, etc.

As an example, a number of iterations of a system that aims to optimize a well trajectory may be of the order of 10 or more. As an example, consider a number of iterations of the order of 100 or more. As an example, consider a number of iterations of the order of 1000 or more. As an example, various blocks associated with an optimizer may include algorithms that can be executed in a manner of seconds or less for a single iteration. As an example, one or more weights and/or templates may be adjusted automatically, semi-automatically and/or manually (e.g., via input). Such adjustment may be based on information about a geologic environment, about a drilling technique to be implemented, about one or more time constraints, etc.

To facilitate the processing and analysis of data, simulators may be used to process the data. Specific simulators are often used in connection with specific oilfield operations, such as reservoir or wellbore production. Data fed into the simulator(s) may be historical data, real time data or combinations thereof. Simulation through one or more of the simulators may be repeated or adjusted based on the data received.

The oilfield operation is provided with wellsite and non-wellsite simulators. The wellsite simulators may include a reservoir simulator, a wellbore simulator, and a surface network simulator. The reservoir simulator solves for hydrocarbon flowrate through the reservoir and into the wellbores. The wellbore simulator and surface network simulator solve for hydrocarbon flowrate through the wellbore and the surface gathering network of pipelines. As shown, some of the simulators may be separate or combined, depending on the available systems.

The non-wellsite simulators may include process and economics simulators. The processing unit has a process simulator. The process simulator models the processing plant (e.g., the process facility) where the hydrocarbon is separated into its constituent components (e.g., methane, ethane, propane, etc.) and prepared for sales. The oilfield is provided with an economics simulator. The economics simulator models the costs of part or a whole of the oilfield. Various combinations of these and other oilfield simulators may be provided.

As an example, the system 800 of FIG. 8 can be a tool that is configured to perform management operations of the field. In some embodiments, the system 800 may be a software tool configured to execute on a computing system. In some embodiments, the system 800 may be a hardware tool, such as a computing system, and may or may not include specialized equipment for management of the field.

As mentioned, the system 800 includes the repository 825, the portal 802, the optimizer 805, and one or more blocks such as, for example, the anti-collision block 812, the torque and/or drag block 814, the hydraulics block 816, the geomechanics block 818 and the geometrical metrics block 820 in accordance with one or more embodiments. In one or more embodiments, each of these blocks (e.g., components, etc.) may be located on the same hardware device or different hardware devices separated by networks of any size having wired and/or wireless segments. Additionally or alternatively, one or more of the blocks 812, 814, 816, 818 and 820 may be plugins to other applications and/or may be accessed by plugins. Additionally or alternatively, one or more of the blocks 812, 814, 816, 818 and 820 may be located in a cloud computing infrastructure. As an example, the system 800 can be a field management tool that may be used at one or more places at one or more times (e.g., at a rig site during drilling, in an office while planning the job, etc.).

In one or more embodiments, the optimizer 805 includes functionality to generate one or more well trajectories. Specifically, the optimizer 805 may generate well trajectories based on one or more parameters (e.g., metrics) that are inputs to the optimizer 805. Such parameters may be weighted by the optimizer 805, for example, according to information in the repository 825. For example, weighted parameters may act as constraints on the optimizer 805 during the generation of the well trajectories. According to an embodiment, the optimizer 805 may invoke an iterative process to generate one or more well trajectories. In one or more embodiments, one or more of the iterations can include the optimizer 805 accessing one or more of the blocks 812, 814, 816, 818 and 820 as part of a process that can generate a well trajectory or well trajectories (e.g., scores for a well trajectory or well trajectories, etc.). As an example, the frequency with which a particular block may be accessed may depend on weighting of one or more parameters. As an example, the blocks 812, 814, 816, 818 and 820 can provide one or more parameters (e.g., metrics). In one or more embodiments, the optimizer 805 can generate one or more well trajectories that do not collide with each other and/or with existing wells in a reservoir (e.g., offset wells, wells from a common pad, wells from different pads, etc.). In one or more embodiments, the optimizer 805 can generate one or more well trajectories that have a substantially common starting location (e.g., same pad or platform) in a field.

In one or more embodiments, the system 800 can include multiple blocks (e.g., consider the blocks or a portion of the blocks 812, 814, 816, 818 and 820). As discussed above, these blocks may be accessed by the optimizer 805 to generate information germane to one or more well trajectories (e.g., via an application programming interface (API), etc.). In another embodiment, blocks may access the optimizer 805 to generate information germane to one or more well trajectories (e.g., via an application programming interface (API), etc.). As an example, one or more of the blocks may execute an engineering analysis of one or more well trajectories generated by the optimizer 805 to determine feasibility and/or equipment that meets certain specifications (e.g., casings, drill strings, etc.) to drill the well trajectory (ies).

In one or more embodiments, the system 800 can include the portal 802. The portal 802 can include functionality to receive user requests to generate one or more well trajectories. The portal 802 may also include functionality to present one or more generated well trajectories to a user. In particular, the portal 802 may include functionality to present a rendering of the well trajectory(ies) (e.g., in two or three dimensions). For example, the portal 802 can be or include a graphical user interface (GUI). As an example, the portal 802 may be a web page or other interface (e.g., a browser application executable portal, etc.).

In one or more embodiments, the portal 802 can include functionality to collect parameters and weights for one or more parameters selected by a user. These parameters and weights may be transmitted to the optimizer 805 to generate one or more well trajectories.

In one or more embodiments, the repository 825 can be a storage unit and/or device (e.g., a file system, database, collection of tables, or any other storage mechanism) for storing data. As an example, the repository 825 may include multiple different storage units and/or devices. The multiple different storage units and/or devices may or may not be of the same type or located at the same physical site.

As shown in the example of FIG. 8, the repository 825 includes the one or more weights and/or templates 827, which may be present as weight templates. For example, an individual weight template can include a set of weights for at least some of the parameters (e.g., metrics, etc.) that may be received by the optimizer 805. As an example, via selection of one of the weight templates, a user may avoid having to individually specify weights for the parameters (e.g., metrics, etc.). As an example, a user may use one or more weight templates as a coarse starting point, and then make fine adjustments to one or more of the weights.

As an example, the repository 825 can includes functionality to store field data. Field data can include, for example, one or more types of data from the field. For example, field data may include, without limitation, sensor data, information about existing wells, and one or more other types of information. The field data may also be sent to the optimizer 805, for example, to generate one or more well trajectories. As an example, information such as field data may be accessible by one or more of the blocks, for example, according to an identifier, a geographical location, etc. that may be provided.

As an example, an initial trajectory may be received by an optimizer where the initial trajectory is defined at least in part within a three-dimensional environment that corresponds to a geologic environment for which at least some information is known about the characteristics of the geologic environment. Individual blocks can execute one or more algorithms that can assess the initial trajectory in space and/or one or more "trial" trajectories that may be generated by the optimizer as potentially viable options. Such spatially defined trajectories or portions thereof may be assessed as to physical phenomena associated with a well, drilling a well, etc. As an example, the optimizer can generate one or more revised or updated trajectories (e.g., sets of points, etc.), which can then be further assessed by one or more of the blocks as may be evidenced via one or more corresponding metrics that can be weighed to determine an overall metric. The overall metric may be assessed as to whether it corresponds to an optimal trajectory (e.g., within the given information, blocks, etc.).

As an example, parameters (e.g., metrics, etc.) that may be sent to (e.g., received by) the optimizer to generate a well trajectory can include, for example, one or more of: total drilling cost; anti-collision with other wells; total reservoir contact; target location (point or volume); vector for intersection of target; torque and/or drag results (e.g. expected weight transfer, bending moments, rig limits); hydraulics results (e.g., keeping the downhole pressure at each depth within a certain range); hole cleaning results; geomechanics results (e.g. the "size" of the mud-weight window); keeping the trajectory as short as possible; dog-leg limits (i.e. maximum curvature); keeping the trajectory as close to a reference/proposed/rough trajectory as possible; keeping a "straight section" of a well as long as possible; keeping a kick-off point within a certain range; avoiding certain risk zones; and one or more other calculations/limits. As an example, one or more weights may be assigned to one or more of such parameters. As an example, a weight can increase or decrease the contribution of a parameter (e.g., a metric).

Figure 9:
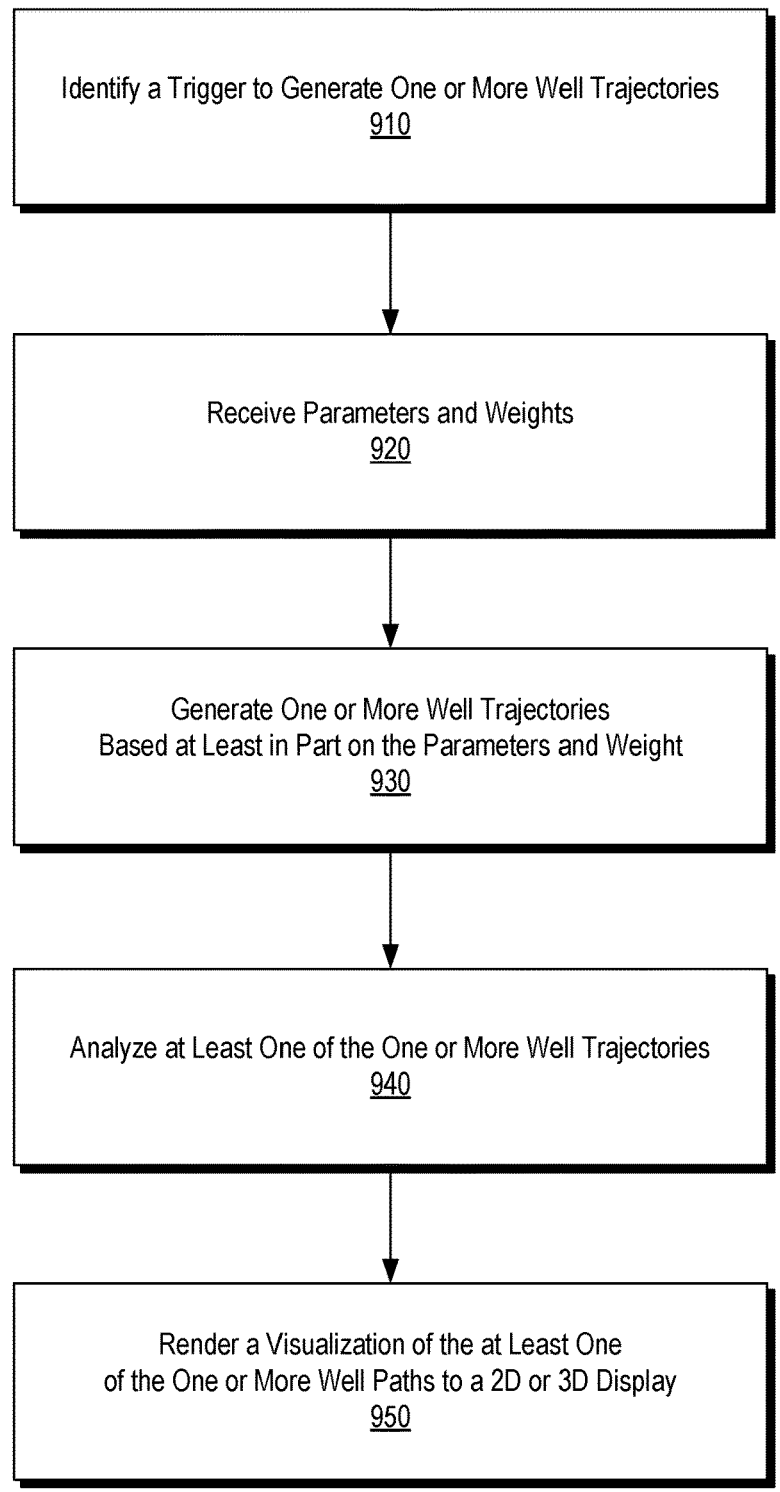
FIG. 9 illustrates an example of a method.

FIG. 9 shows an example of a method 900 that includes an identification block 910 for identifying a trigger to generate one or more well trajectories (e.g., well trajectories), a reception block 920 for receiving parameters and weights, a generation block 930 for generating one or more well trajectories based at least in part on the parameters and weights and an analysis block 940 for analyzing at least one of the one or more well trajectories and a render block 950 for rendering a visualization of the at least one of the one or more well trajectories to a 2D or a 3D display. In such an example, the parameters can be metrics, for example, as generated by one or more of the blocks 812, 814, 816, 818 and 820 of the system 800. As an example, the weights can be weights of the repository 825. As an example, the analyzing of the block 940 of the method 900 can be performed, for example, via the optimizer 805 of the system 800. As an example, as to the render block 950, rendering may occur at least in part via the portal 802 of the system 800.

As an example, the method 900 can be a method for well planning. As an example, a trigger that can generate one or more well trajectories can be identified. For example, such a trigger may include a user request to generate the well trajectory(ies). Additionally or alternatively, the trigger may include an update to one or more input values/objects for generating the well trajectory(ies) and/or the trigger may be the submission of the input values/objects for generating the well trajectory(ies). Additionally or alternatively, the trigger may include predetermined (e.g., an automatic part of the software), and not need the user to identify the trigger.

As an example, a method can include transmitting parameters and weights to an optimizer. As an example, a method can include selecting one or more parameters and/or weights by a user (e.g., via a GUI, etc.). As an example, one or more weights may be obtained from a weight template, which may be a default template, a user selected template, etc.

As an example, a method can include generating via an optimizer one or more well trajectories based on parameters and weights. In such an example, generating the one or more well trajectories may include an iterative process. One or more iterations may include the optimizer accessing (e.g., exchange data with) one or more specialized blocks (e.g., anti-collision, torque and/or drag, hydraulics, geomechanics, geometricals, etc.). In one or more embodiments, the one or more wells do not intersect (e.g., do not collide) with each other and/or with existing wells in the reservoir. In one or more embodiments, multiple wells may have a substantially common starting location (e.g., same pad or platform).

In one or more embodiments, the optimizer may automatically design the curved portion of the trajectory according to the specified weighted parameters, and then append a vertical section about the kick-off point (KOP), and a horizontal section below the first target.

In one or more embodiments, the optimizer may automatically design the trajectory, mud, BHA, and drilling parameters taking account of the weighted parameters.

In one or more embodiments, the optimizer may automatically choose which trajectory to tie-in to, and automatically choose the tie-in point.

In one or more embodiment, the optimizer may simultaneously design all of the trajectories (and/or other objects) for an entire pad or platform, taking into account all of the weighted parameters.

In one or more embodiments, the optimizer may "cover" the reservoir with a number of wells given the above weighted parameters. For example, where production per well is to be increased, a fewer number of wells may be utilized.

In one or more embodiments, the optimizer may adjust the trajectories (and/or other objects) for one or more other wells of an entire pad or platform, after one or more of them has been drilled, taking into account all of the weighted parameters.

In one or more embodiments, the optimizer may allow the trajectory to contain one or more sidetracks (e.g. automatically designing a fishbone well, and deciding whether or not a fishbone is needed).

In one or more embodiments, the optimizer may automatically design the pad location and/or platform location.

In one or more embodiments, the optimizer may be able to avoid one or more surface locations.

In one or more embodiments, the optimizer may automatically design the location of multiple pads (or platforms) and/or the number of pads (or platforms) to use.

As an example, a method such as the method 900 can include performing an engineering analysis, for example, as to one or more of the generated well trajectories. As an example, a method can include rendering one or more of well trajectories to a display. A 1D, 2D or 3D rendering or renderings of one or more well trajectories may be presented to a user. As an example, one or more wells may be drilled in the reservoir based on the generated well trajectory(ies).

As an example, a method can include outputting at least one well trajectory where such a well trajectory may be output as a well plan, for example, in digital form. In such an example, a system such as, for example, the system 670 of FIG. 6 may be operated at least in part based on such a well plan. For example, a well plan may be in digital form and received by the drilling services 696 and utilized to instruct, control, guide, etc. one or more actions at a wellsite that includes wellsite equipment for drilling at least a portion of a bore (e.g., a wellbore, etc.).

Figure 10:
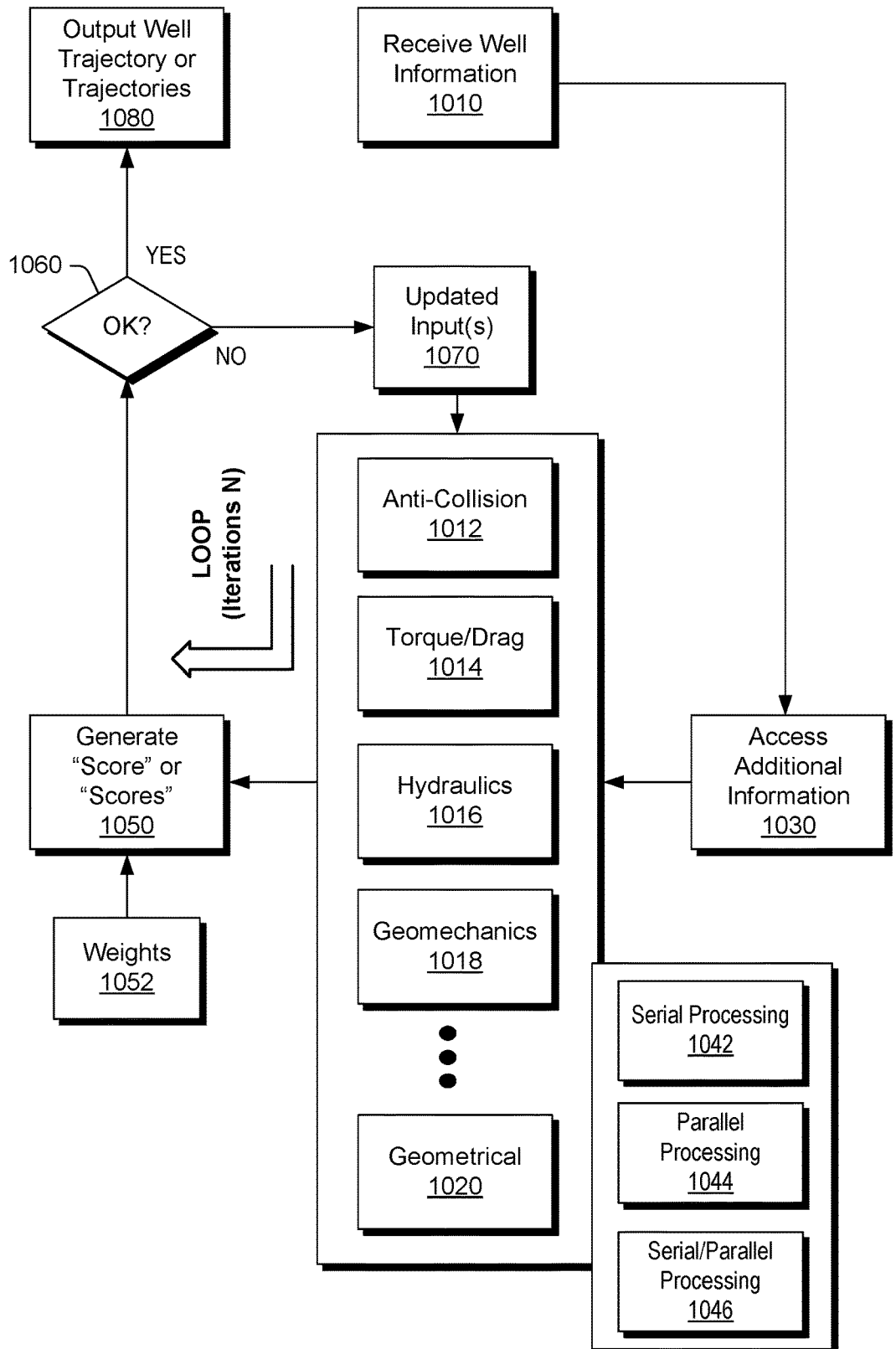
FIG. 10 illustrates an example of a method.

FIG. 10 shows an example of a method 1000 that includes a reception block 1010 for receiving well information, an access block 1030 for accessing additional information, a plurality of blocks 1012, 1014, 1016, 1018 and 1020 that can be utilized for generating metrics (e.g., parameters), a generation block 1050 for generating at least one score based at least in part on receipt of one or more weights 1052, a decision block 1060 for deciding whether a score is "optimal", an update block 1070 for updating at least one input to at least a portion of the plurality of blocks and an output block 1080 for outputting a well trajectory or well trajectories.

As shown in the example of FIG. 10, the method 1000 can include a loop that can iterate a number of iterations (e.g., "N"). Such a loop may be limited in a number of iterations, a time period, etc. As an example, the decision block 1060 can include determining a delta or deltas that represent a change in a score or scores for successive iterations. As an example, where such a delta or deltas drop below a predetermined level or other criterion (or criteria), the method 1000 may proceed to the output block 1080 or continue to another action, which may include adjusting one or more weights, templates, etc.

In the example of FIG. 10, one or more of blocks 1042, 1044 and 1046 may be implemented for serial processing, parallel processing or serial and parallel processing.

Figure 11:
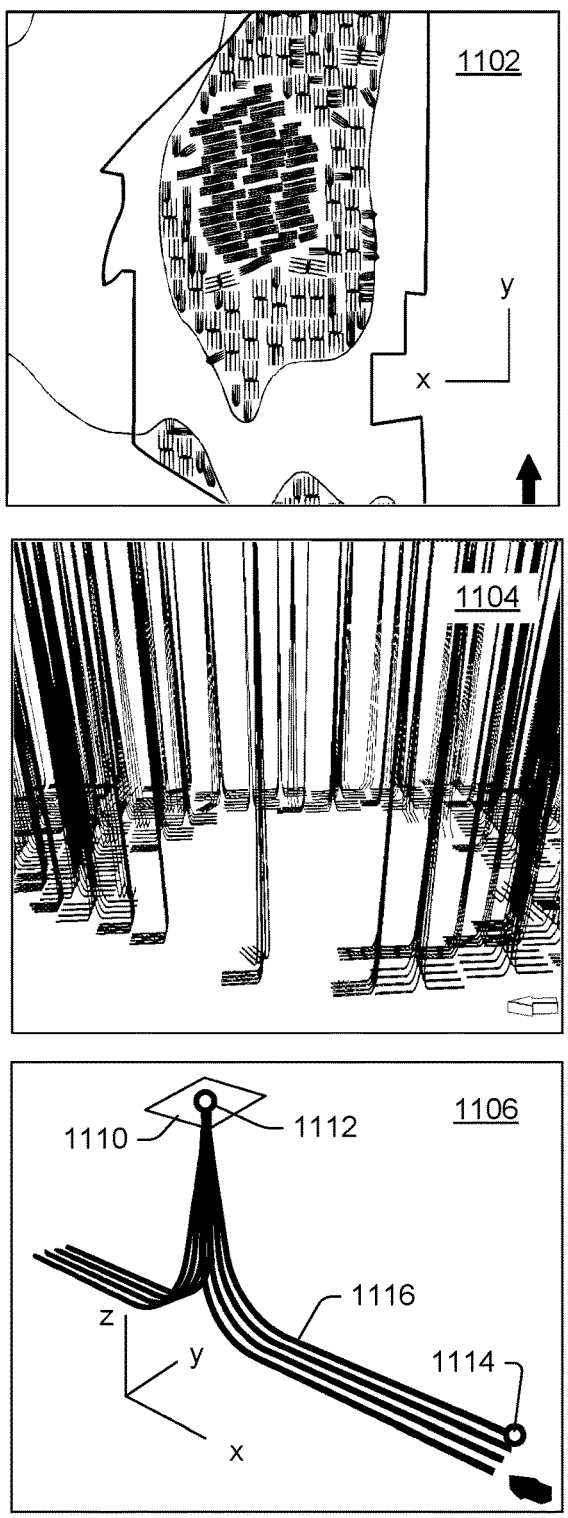
FIG. 11 illustrates examples of graphical user interfaces and an example of a method.
Figure 11:
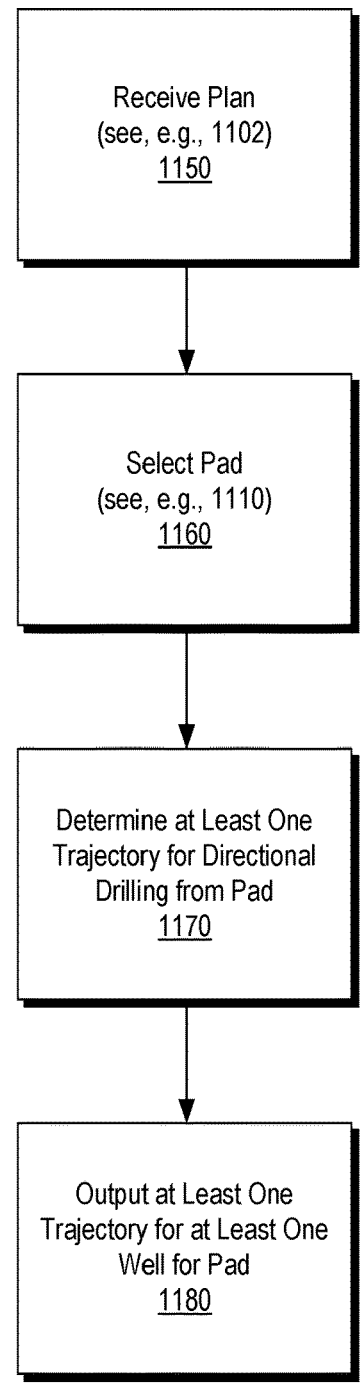

FIG. 11 shows examples of graphical user interfaces 1102, 1104 and 1106 associated with an example of a workflow. For example, a well pad placement framework may position a plurality of well pads in an environment as shown in the GUI 1102 where each of the well pads is specified to have at least one well drilled therefrom, as shown in the GUI 1104. In the example of FIG. 11, the GUI 1106 illustrates a single pad 1110 that includes a wellhead point 1112 and where a toe point 1114 is shown at the end of a well trajectory 1116 that extends between the wellhead point 1114 and the toe point 1114. As an example, the well trajectory 1116 may be an approximate well trajectory that is suitable for use as an initial well trajectory to be input on a first iteration of an optimizer such as, for example, the optimizer 805 of the system 800.

In the example of FIG. 11, a method 1140 includes a reception block 1150 for receiving a plan, a selection block 1160 for selecting a pad, a determination block 1170 for determining at least one trajectory for directional drilling from the pad, and an output block 1180 for outputting at least one trajectory for at least one well for the pad.

As an example, the system 800 of FIG. 8 may be implemented to perform at least a portion of the method 1140 of FIG. 11. As an example, a workflow may aim to output trajectories for a plurality of the wells illustrated in the GUIs 1102, 1104 and/or 1106. Such a workflow or workflows may be expected to be completed in a period of time. As an example, consider a period of time that is less than about 10 days. As an example, a period of time may be less than about 5 days.

As an example, the trajectories illustrated in the GUIs 1102, 1104 and 1106 may be specified as points in a three-dimensional space. Such points may define rudimentary well trajectories, each with a head point and an end point, which may be, for example, a toe point where a well trajectory is at least in part deviated (e.g., horizontal). As an example, output from the method 1140 can include outputting points in a three-dimensional space where the points are spatially refined to account for one or more physical phenomena such as, for example, one or more types of physical phenomena as associated with the blocks 812, 814, 816, 818 and 820 of the system 800 of FIG. 8.

As an example, a set of points that defines a well trajectory may be output from the method 1140 and be suitable for use by a driller to commence drilling of a trajectory in an environment and to direct drilling equipment to form at least a portion of the trajectory. Such a set of points can be expected to be different from a set of points for the trajectory 1116 because various physical conditions have been accounted for via a system such as, for example, the system 800 of FIG. 8.

As an example, output from a method, a system, etc. can include points that specify a trajectory where the points can be utilized by a driller at a wellsite to drill a trajectory based at least in part on the points. As an example, output can be in the form of a well plan.

Figure 12:
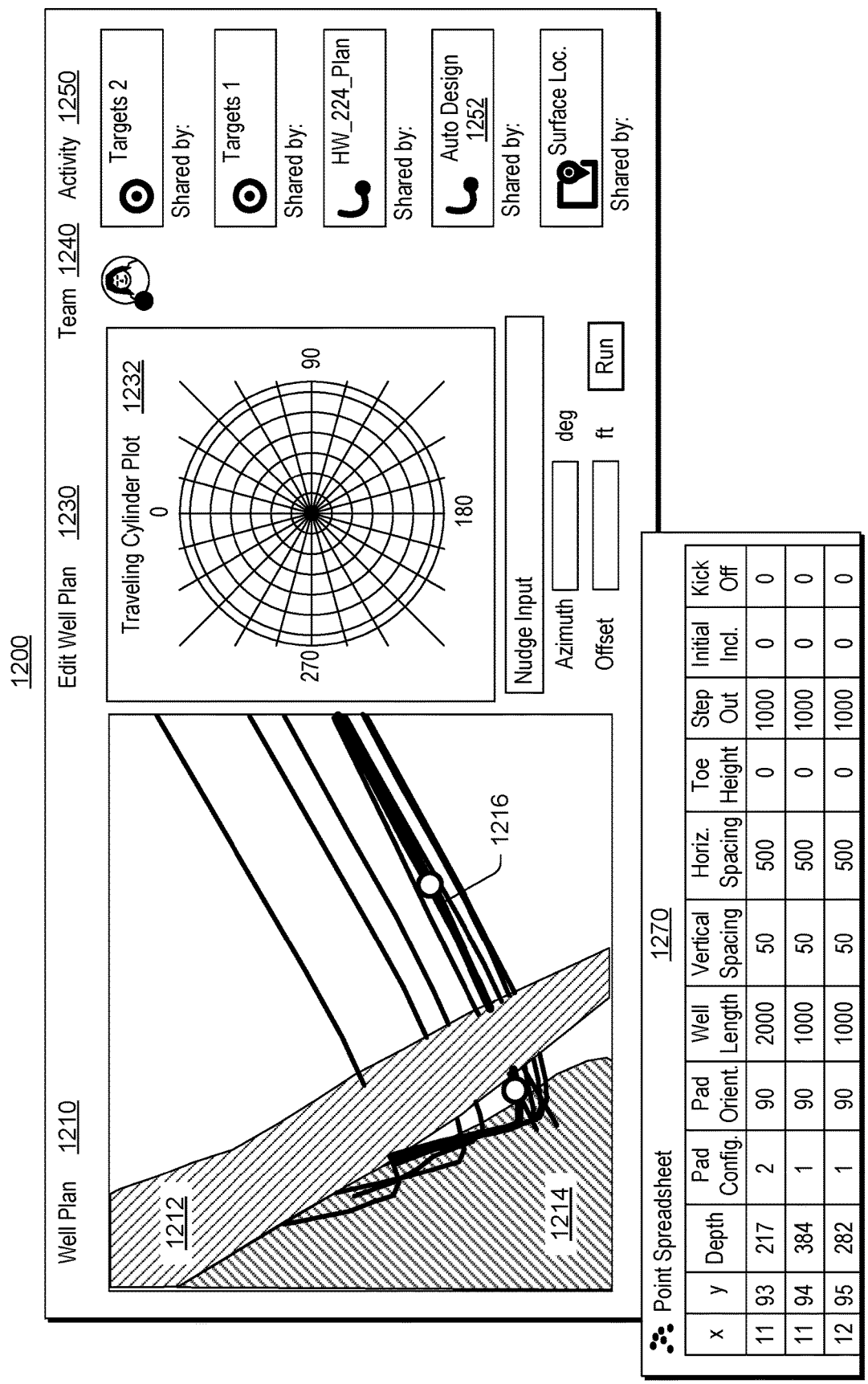
FIG. 12 illustrates an example of a graphical user interface.

FIG. 12 shows an example of a GUI 1200 that can be rendered to a display. As shown, the GUI 1200 includes a well plan 1210, structural features of a geologic environment 1212 and 1214 and trajectories where a particular trajectory 1216 is selected. As an example, the trajectories can be defined via points, as illustrated in a points spreadsheet 1270. As an example, one or more selected trajectories may be edited via one or more editing features of the GUI 1200. For example, the GUI 1200 includes an example of an edit well plan feature 1230 and an example of a traveling cylinder plot 1232, which may be utilized, for example, to edit one or more points of a trajectory (e.g., drag and drop), for example, along one or more portions of a trajectory. As shown in the example of FIG. 12, a nudge input graphical control can include associated azimuth and offset input blocks. As an example, a "run" control can cause execution of a process such as, for example, an automated trajectory optimization process that can account for one or more specified adjustments to a trajectory (e.g., per inputs as to azimuth and/or offset, etc.).

As an example, the GUI 1200 can include team information 1240 and, for example, activity information 1250. In the example of FIG. 12, the GUI 1200 is shown as including a block 1252, which can correspond to an automated trajectory process such as, for example, the method 900 of FIG. 9, which may implement a system such as, for example, the system 800 of FIG. 8.

As an example, a method can include receiving well plan information that includes a reservoir target associated with a reservoir of a subterranean environment; based at least in part on characteristics of the subterranean environment, determining well trajectory metrics that include a geometrical metric; determining a weighted metric based at least in part on weighting of the well trajectory metrics; and, based at least in part on an assessment of the weighted metric, outputting directional drilling information for a well trajectory to the reservoir target.

As an example, a geometrical metric can be a well trajectory curvature metric. As an example, a geometrical metric can be a well trajectory length metric. As an example, a geometrical metric can be a depth at which a well trajectory deviates from vertical metric. As an example, a geometrical metric may be represented at least in part by and/or determined at least in part by a point or points in a three-dimensional coordinate system.

As an example, well trajectory metrics can include an anti-collision metric. As an example, well trajectory metrics can include at least one member selected from a friction metric, a geomechanical metric and a hydraulics metric. As an example, a friction metric may account for friction between drillpipe and a bore wall defined by characteristics of a subterranean environment. As an example, a geomechanical metric may account for pore pressure in a subterranean environment. As an example, a hydraulics metric may account for transport of drill bit cuttings in a bore in the subterranean environment.

As an example, an assessment can include comparing a weighted metric (e.g., a score) to one or more other weighted metrics (e.g., one or more other scores). As an example, a weighted metric can be a summation of individually weighted values for each of the well trajectory metrics. As an example, a weighted metric may be a score that is based at least in part on at least one weight and at least two metrics.

As an example, a method can include determining well trajectory metrics at least in part via parallel processing.

As an example, a method can include repeating determining well trajectory metrics that include a geometrical metric and determining a weighted metric based at least in part on weighting of the well trajectory metrics where such repeating is based at least in part on an assessment of a prior determined weighted metric.

As an example, a system can include one or more processors; memory operatively coupled to the one or more processors; processor-executable instructions stored in the memory and executable by at least one of the processors to instruct the system to receive well plan information that includes a reservoir target associated with a reservoir of a subterranean environment; based at least in part on characteristics of the subterranean environment, determine well trajectory metrics that include a geometrical metric; determine a weighted metric based at least in part on weighting of the well trajectory metrics; and based at least in part on an assessment of the weighted metric, output directional drilling information for a well trajectory to the reservoir target. In such an example, the well trajectory metrics can include at least one member selected from an anti-collision metric, a friction metric, a geomechanical metric and a hydraulics metric.

As an example, directional drilling information can include points defined in a three-dimensional coordinate system in a region of a subterranean environment. As an example, a system can include instructions to instruct the system to render a graphical user interface to a display where the graphical user interface includes a well trajectory editor. In such an example, the graphical user interface can include a graphical control that is selectable to call for optimization of an edited well trajectory.

As an example, a system can include instructions to instruct the system to determine at least two well trajectory metrics at least in part simultaneously via parallel processing.

As an example, one or more computer-readable storage media can include computer-executable instructions executable to instruct a computing system to: receive well plan information that includes a reservoir target associated with a reservoir of a subterranean environment; based at least in part on characteristics of the subterranean environment, determine well trajectory metrics that include a geometrical metric; determine a weighted metric based at least in part on weighting of the well trajectory metrics; and, based at least in part on an assessment of the weighted metric, output directional drilling information for a well trajectory to the reservoir target. In such an example, instructions can be include to instruct the computing system to output the directional drilling information at least in part as points defined in a three-dimensional coordinate system. As an example, one or more additional well trajectory metrics may be included in addition to, for example, a geometrical metric.

As an example, one or more computer-readable storage media can include computer-executable instructions executable to instruct a computing system to receive one or more weights that weigh at least one of the well trajectory metrics.

According to an embodiment, one or more computer-readable media may include computer-executable instructions to instruct a computing system to output information for controlling a process. For example, such instructions may provide for output to sensing process, an injection process, drilling process, an extraction process, an extrusion process, a pumping process, a heating process, etc.

Figure 13:
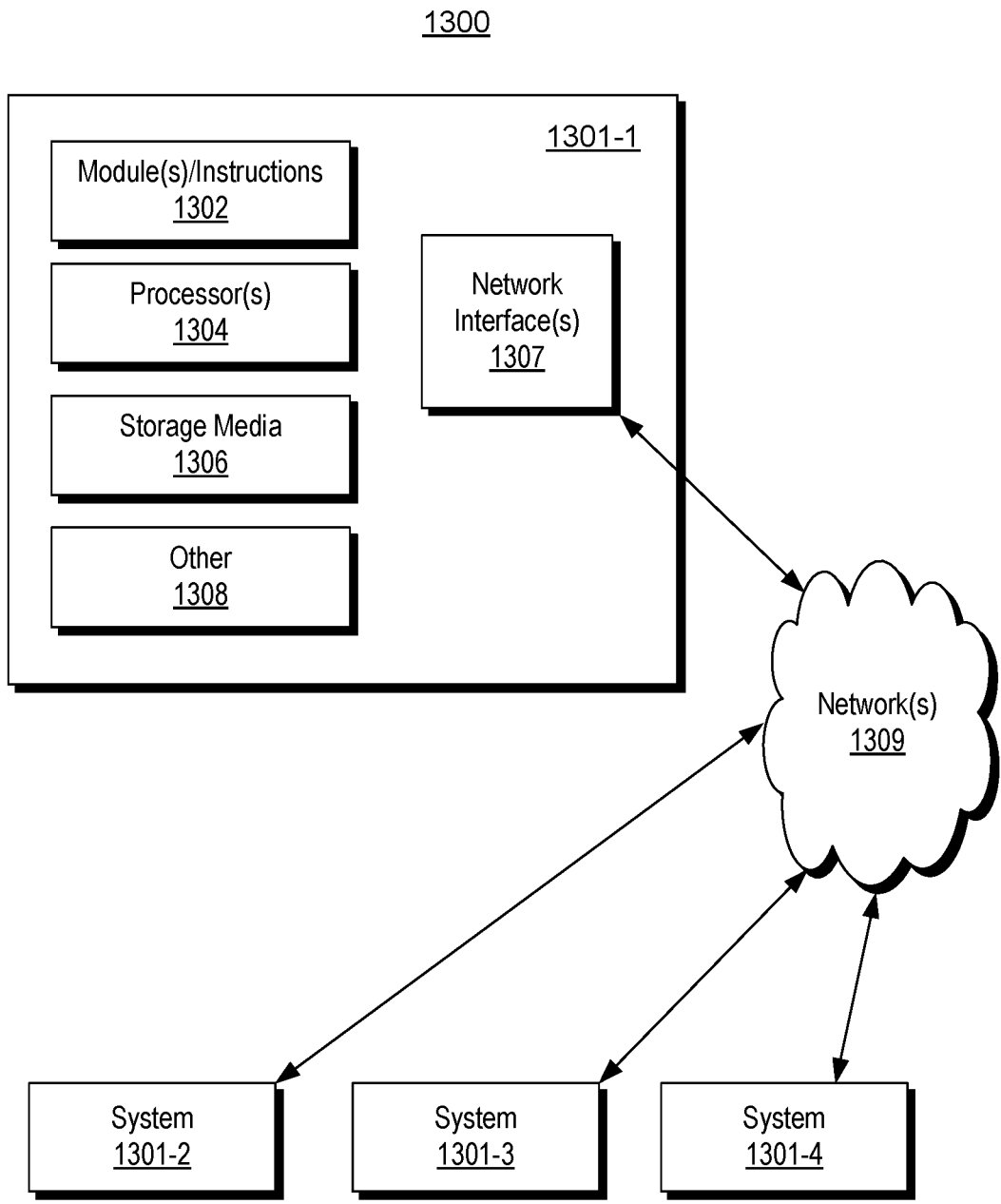
FIG. 13 illustrates examples of computing and networking equipment.

In some embodiments, a method or methods may be executed by a computing system. FIG. 13 shows an example of a system 1300 that can include one or more computing systems 1301-1, 1301-2, 1301-3 and 1301-4, which may be operatively coupled via one or more networks 1309, which may include wired and/or wireless networks.

As an example, a system can include an individual computer system or an arrangement of distributed computer systems. In the example of FIG. 13, the computer system 1301-1 can include one or more modules 1302, which may be or include processor-executable instructions, for example, executable to perform various tasks (e.g., receiving information, requesting information, processing information, simulation, outputting information, etc.).

As an example, a module may be executed independently, or in coordination with, one or more processors 1304, which is (or are) operatively coupled to one or more storage media 1306 (e.g., via wire, wirelessly, etc.). As an example, one or more of the one or more processors 1304 can be operatively coupled to at least one of one or more network interface 1307. In such an example, the computer system 1301-1 can transmit and/or receive information, for example, via the one or more networks 1309 (e.g., consider one or more of the Internet, a private network, a cellular network, a satellite network, etc.).

As an example, the computer system 1301-1 may receive from and/or transmit information to one or more other devices, which may be or include, for example, one or more of the computer systems 1301-2, etc. A device may be located in a physical location that differs from that of the computer system 1301-1. As an example, a location may be, for example, a processing facility location, a data center location (e.g., server farm, etc.), a rig location, a wellsite location, a downhole location, etc.

As an example, a processor may be or include a microprocessor, microcontroller, processor module or subsystem, programmable integrated circuit, programmable gate array, or another control or computing device.

As an example, the storage media 1306 may be implemented as one or more computer-readable or machine-readable storage media. As an example, storage may be distributed within and/or across multiple internal and/or external enclosures of a computing system and/or additional computing systems.

As an example, a storage medium or storage media may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUERAY® disks, or other types of optical storage, or other types of storage devices.

As an example, a storage medium or media may be located in a machine running machine-readable instructions, or located at a remote site from which machine-readable instructions may be downloaded over a network for execution.

As an example, various components of a system such as, for example, a computer system, may be implemented in hardware, software, or a combination of both hardware and software (e.g., including firmware), including one or more signal processing and/or application specific integrated circuits.

As an example, a system may include a processing apparatus that may be or include a general purpose processors or application specific chips (e.g., or chipsets), such as ASICs, FPGAs, PLDs, or other appropriate devices.

Figure 14:
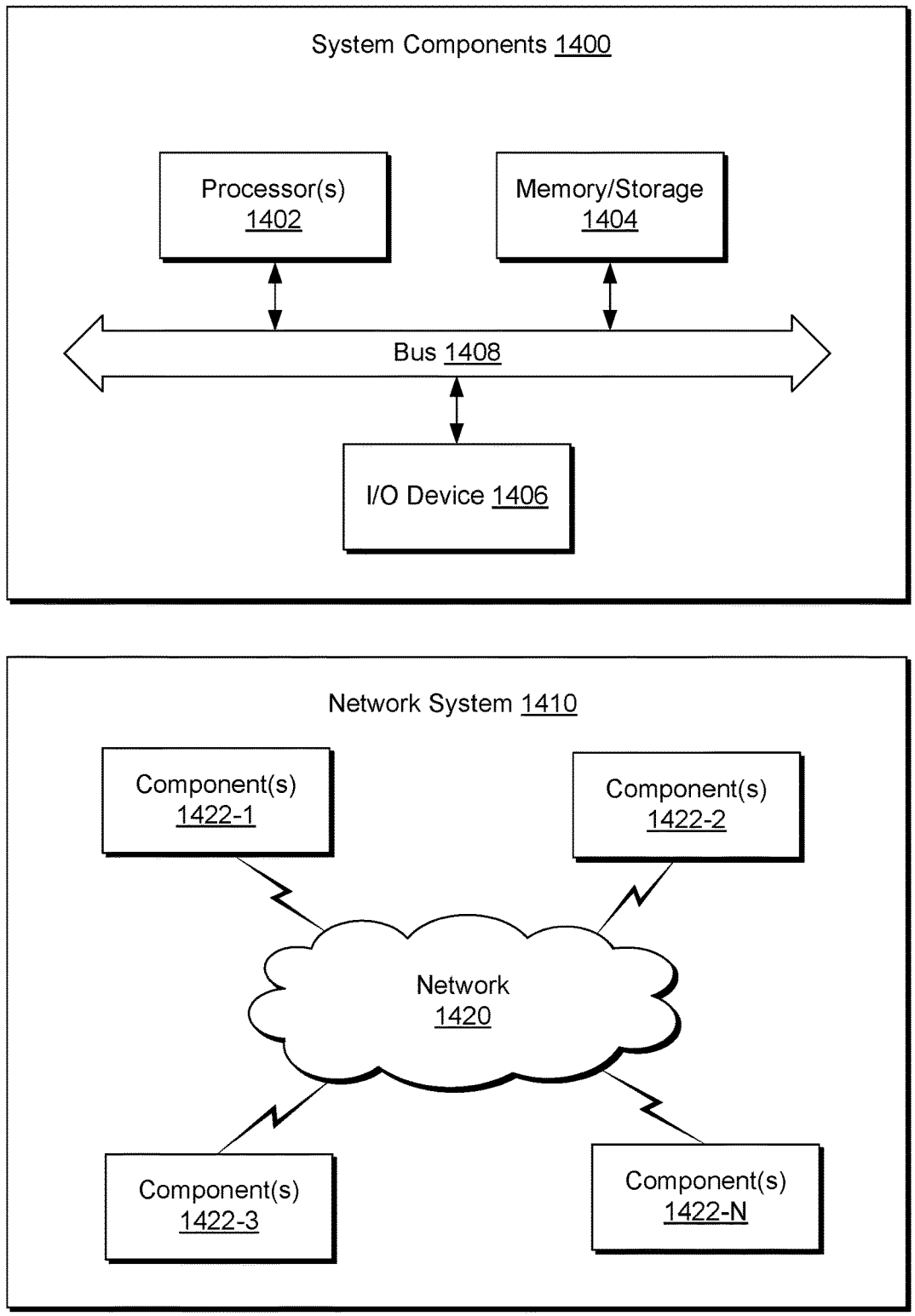
FIG. 14 illustrates example components of a system and a networked system.

FIG. 14 shows components of a computing system 1400 and a networked system 1410. The system 1400 includes one or more processors 1402, memory and/or storage components 1404, one or more input and/or output devices 1406 and a bus 1408. According to an embodiment, instructions may be stored in one or more computer-readable media (e.g., memory/storage components 1404). Such instructions may be read by one or more processors (e.g., the processor(s) 1402) via a communication bus (e.g., the bus 1408), which may be wired or wireless. The one or more processors may execute such instructions to implement (wholly or in part) one or more attributes (e.g., as part of a method). A user may view output from and interact with a process via an I/O device (e.g., the device 1406). According to an embodiment, a computer-readable medium may be a storage component such as a physical memory storage device, for example, a chip, a chip on a package, a memory card, etc.

According to an embodiment, components may be distributed, such as in the network system 1410. The network system 1410 includes components 1422-1, 1422-2, 1422-3, . . . 1422-N. For example, the components 1422-1 may include the processor(s) 1402 while the component(s) 1422-3 may include memory accessible by the processor(s) 1402. Further, the component(s) 1402-2 may include an I/O device for display and optionally interaction with a method. The network 1420 may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few examples have been described in detail above, those skilled in the art will readily appreciate that many modifications are possible in the examples. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method comprising:
   via a computing system, receiving well plan information that comprises a reservoir target associated with a reservoir of a subterranean environment;
   based at least in part on characteristics of the subterranean environment, via the computing system, determining well trajectory metrics that comprise a geometrical metric;
   via the computing system, determining a weighted metric based at least in part on weighting of the well trajectory metrics; and
   based at least in part on an assessment of the weighted metric, via the computing system, outputting directional drilling information to wellsite equipment for drilling at least a portion of a borehole of a well trajectory to the reservoir target, wherein the assessment comprises comparing the weighted metric to one or more other weighted metrics.

2. The method of claim 1 wherein the geometrical metric comprises a well trajectory curvature metric.

3. The method of claim 1 wherein the geometrical metric comprises a well trajectory length metric.

4. The method of claim 1 wherein the geometrical metric comprises a depth at which a well trajectory deviates from vertical metric.

5. The method of claim 1 wherein the well trajectory metrics comprise an anti-collision metric.

6. The method of claim 1 wherein the well trajectory metrics comprise at least one member selected from a group consisting of a friction metric, a geomechanical metric and a hydraulics metric; wherein the friction metric accounts for friction between drillpipe and a bore wall defined by characteristics of the subterranean environment, wherein the geomechanical metric accounts for pore pressure in the subterranean environment, and wherein the hydraulics metric accounts for transport of drill bit cuttings in a bore in the subterranean environment.

7. The method of claim 1 wherein the weighted metric comprises a summation of individually weighted values for each of the well trajectory metrics.

8. The method of claim 1 wherein the determining well trajectory metrics comprises parallel processing.

9. The method of claim 1 comprising repeating the determining the weighted metric based at least in part on the assessment of the weighted metric.

10. The method of claim 1 comprising drilling the at least a portion of the borehole.

11. A system comprising:
one or more processors;
memory operatively coupled to the one or more processors;
processor-executable instructions stored in the memory and executable by at least one of the processors to instruct the system to:
receive well plan information that comprises a reservoir target associated with a reservoir of a subterranean environment;
based at least in part on characteristics of the subterranean environment, determine well trajectory metrics that comprise a geometrical metric;
determine a weighted metric based at least in part on weighting of the well trajectory metrics; and
based at least in part on an assessment of the weighted metric, output directional drilling information to wellsite equipment for drilling at least a portion of a borehole for a well trajectory to the reservoir target, wherein the assessment comprises a comparison of the weighted metric to one or more other weighted metrics.

12. The system of claim 11 wherein the well trajectory metrics comprise at least one member selected from a group consisting of an anti-collision metric, a friction metric, a geomechanical metric and a hydraulics metric.

13. The system of claim 11 wherein the directional drilling information comprises points defined in a three-dimensional coordinate system in a region of the subterranean environment.

14. The system of claim 11 comprising processor-executable instructions stored in the memory and executable by at least one of the processors to instruct the system to render a graphical user interface to a display wherein the graphical user interface comprises a well trajectory editor.

15. The system of claim 14 wherein the graphical user interface comprises a graphical control that is selectable to call for optimization of an edited well trajectory.

16. The system of claim 11 comprising processor-executable instructions stored in the memory and executable by at least one of the processors to instruct the system to determine at least two of the well trajectory metrics at least in part simultaneously via parallel processing.

17. One or more computer-readable storage media comprising computer-executable instructions executable to instruct a computing system to:
receive well plan information that comprises a reservoir target associated with a reservoir of a subterranean environment;
based at least in part on characteristics of the subterranean environment, determine well trajectory metrics that comprise a geometrical metric;
determine a weighted metric based at least in part on weighting of the well trajectory metrics; and
based at least in part on an assessment of the weighted metric, output directional drilling information to wellsite equipment for drilling a well trajectory to the reservoir target, wherein the weighted metric comprises a summation of individually weighted values for each of the well trajectory metrics.

18. The one or more computer-readable storage media of claim 17 comprising computer-executable instructions executable to instruct a computing system to output the directional drilling information at least in part as points defined in a three-dimensional coordinate system.

19. The one or more computer-readable storage media of claim 17 comprising one or more additional well trajectory metrics.

20. The one or more computer-readable storage media of claim 17 comprising computer-executable instructions executable to instruct a computing system to receive one or more weights that weigh at least one of the well trajectory metrics.

* * * * *